United States Patent
Mizutani

(10) Patent No.: US 7,250,246 B2
(45) Date of Patent: Jul. 31, 2007

(54) POSITIVE RESIST COMPOSITION AND PATTERN FORMATION METHOD USING THE SAME

(75) Inventor: Kazuyoshi Mizutani, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/041,384

(22) Filed: Jan. 25, 2005

(65) Prior Publication Data
US 2005/0164123 A1    Jul. 28, 2005

(30) Foreign Application Priority Data
Jan. 26, 2004    (JP)    ............... P.2004-016613

(51) Int. Cl.
G03C 1/73    (2006.01)
G03F 7/039    (2006.01)
G03F 7/20    (2006.01)
G03F 7/30    (2006.01)

(52) U.S. Cl. .................... 430/270.1; 430/326; 430/910

(58) Field of Classification Search .................... None
See application file for complete search history.

(56) References Cited

U.S. PATENT DOCUMENTS

| | | | | |
|---|---|---|---|---|
| 6,649,322 | B2 * | 11/2003 | Kumon et al. | 430/270.1 |
| 6,787,283 | B1 * | 9/2004 | Aoai et al. | 430/270.1 |
| 2003/0017415 | A1 * | 1/2003 | Kodama et al. | 430/287.1 |

FOREIGN PATENT DOCUMENTS

| | | |
|---|---|---|
| EP | 1 357 428 A1 | 10/2003 |
| JP | 10-53621 A | 2/1998 |
| JP | 2002-323768 A | 11/2002 |
| JP | 2003-177537 A | 6/2003 |
| JP | 2003-322970 | * 11/2003 |
| JP | 2003-322970 A | 11/2003 |

OTHER PUBLICATIONS

Machine-assisted English translation of JP 2003-322970 (Hirayama et al) provided by JPO.*
T. Fischer et al., Proc. SPIE, vol. 2483, pp. 53-60 (1995) Influence of acid generator structure on T-top formation in high temperature bake processes for environmental stabilization.
Akio Naka, "Resist Composition and Method for Forming Resist Pattern by Using the Same", Patent Abstracts of Japan—2000 131847 (2000).
Juichi Takayama, "Positive Resist Composition and Method for Forming Pattern by Using the Same", Patent Abstracts of Japan—2003 322970 (2003).
European Search Report dated Jun. 9, 2005.

* cited by examiner

*Primary Examiner*—Sin Lee
(74) *Attorney, Agent, or Firm*—Sughrue Mion, PLLC

(57) ABSTRACT

A positive resist composition which can be suitably used in an ultramicrolithography process such as production of VLSI or high-capacity microchip and in other photofabrication processes and can ensure good sensitivity, resolution, pattern profile and line edge roughness when irradiated with actinic rays or radiation, particularly, electron beam, X-ray or EUV; and a pattern formation method using the composition, are provided, the positive resist composition comprising (A) a resin comprising a specific acryl-based repeating unit and a specific styrene-based repeating unit, which increases the dissolution rate in an alkali developer by the action of an acid, (B) a compound capable of generating an acid upon irradiation with actinic rays or radiation, and (C) a solvent; and a pattern formation method using the composition.

18 Claims, No Drawings

POSITIVE RESIST COMPOSITION AND PATTERN FORMATION METHOD USING THE SAME

BACKGROUND OF THE INVENTION

1. Field of the Invention

The present invention relates to a positive resist composition sensitive to far ultraviolet ray, which is used for fine processing of a semiconductor device or the like. More specifically, the present invention relates to a positive resist composition for exposure with electron beam, X-ray or EUV.

2. Background Art

The integration degree of integrated circuits is recently becoming higher and higher and in the production of a semiconductor substrate such as VLSI, an ultrafine pattern having a line width of half-micron or less is demanded.

Non-Patent Document 1: Proc. SPIE, Vol. 2483, page 53 (1995) discloses a positive resist composition containing a copolymer of hydroxystyrene and tert-butyl acrylate, and Patent Documents 1 to 3: JP-A-10-53621 (the term "JP-A" as used herein means an "unexamined published Japanese patent application"), JP-A-2002-323768 and JP-A-2003-177537 disclose a positive resist composition containing an acid-decomposable polyhydroxystyrene. Patent Document 4: JP-A-2003-322970 discloses a resist comprising a copolymer containing α-hydroxyacrylate-based monomer and hydroxystyrene.

However, along with the requirement for enhanced performance, these resists comprising a resin having an aromatic ring suitable for lithography by electron beam or the like, such as styrene skeleton, are demanded to be more improved, for example, in the sensitivity, resolution, pattern profile and line edge roughness.

SUMMARY OF THE INVENTION

Accordingly, an object of the present invention is to provide a positive resist composition which can be suitably used in an ultramicrolithography process such as production of VLSI or high-capacity microchip and in other photofabrication processes and can ensure good sensitivity, resolution, pattern profile and line edge roughness when irradiated with actinic rays or radiation, particularly, electron beam, X-ray or EUV.

As a result of intensive studies on the constituent materials of a chemical amplification-type positive resist composition, the present inventors have found that the object of the present invention can be attained by the following constitutions. The present invention has been accomplished based on this finding.

1. A positive resist composition comprising:

(A) a resin comprising a repeating unit represented by formula (I) and a repeating unit represented by formula (II), the resin increasing the dissolution rate in an alkali developer by the action of an acid;

(B) a compound capable of generating an acid upon irradiation with actinic rays or radiation; and (C) a solvent:

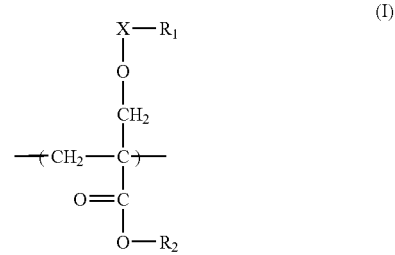

wherein $R_1$ represents a hydrogen atom or a hydrocarbon group, $R_2$ represents a hydrocarbon group, and X represents a single bond or a carbonyl group;

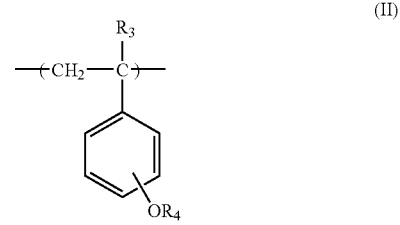

wherein $R_3$ represents a hydrogen atom, a methyl group or a halogen atom, and $R_4$ represents a hydrogen atom or a hydrocarbon group which may have a heteroatom, provided that at least one of $R_2$ and $R_4$ is a group capable of decomposing by the action of an acid.

2. The positive resist composition as described in the item 1, wherein $R_2$ in formula (I) is any one of the following formulae (pI) to (pV):

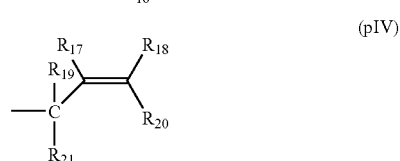

-continued

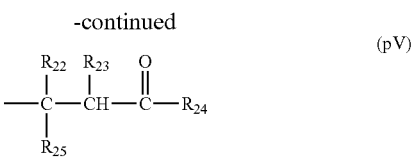

wherein $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents a linear or branched allyl group having from 1 to 4 carbon atoms or an alicyclic hydrocarbon group, provided that at least one of $R_{12}$ to $R_{14}$ and either one of $R_{15}$ and $R_{16}$ represent an alicyclic hydrocarbon group, $R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

3. The positive resist composition as described in the item 1 or 2, wherein $R_4$ in the formula (II) is a group represented by the following formula (A):

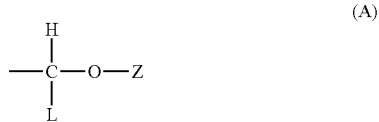

wherein L represents a hydrogen atom, an alkyl group, a cycloalkyl group or an aralkyl group, Z represents an alkyl group, a cycloalkyl group, an aralkyl group or an aryl group, and Z and L may combine with each other to form a 5- or 6-membered ring.

4. The positive resist composition as described in the item 3, wherein Z in the formula (A) represents a cycloalkyl group, an aralkyl group, or an alkyl group having a cyclic carbon structure as a substituent.

5. The positive resist composition as described in the item 1 or 2, wherein $R_4$ in the formula (II) is a tertiary alkoxycarbonyl group, a tertiary alkoxycarbonyl alkyl group, a tertiary alkyl group or a group represented by the following formula (B):

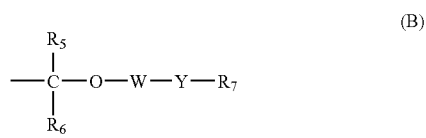

wherein $R_5$ and $R_6$ each independently represents a hydrogen atom or an alkyl group, $R_7$ represents an alkyl group, a cycloalkyl group, an aryl group or an aralkyl group, W represents a single bond or a divalent organic group, and Y represents a single bond, —O—, —CO$_2$—, —OCO—, —CO—, —S— or —SO$_2$—.

6. The positive resist composition as described in any one of the items 1 to 5, wherein the substitution position of —OR$_4$ in the formula (II) is the para-position of the benzene ring.

7. The positive resist composition as described in any one of the items 1 to 6, wherein the resin (A) further comprises a polyhydroxystyrene repeating unit.

8. The positive resist composition as described in any one of the items 1 to 7, wherein when —COOR$_2$ in formula (I) is an acid-decomposable group, $R_4$ in formula (II) is a hydrogen atom.

9. The positive resist composition as described in any one of the items 1 to 7, wherein when —OR$_4$ in formula (II) is an acid-decomposable group, the resin (A) further comprises a polyhydroxystyrene repeating unit.

10. The positive resist composition as described in any one of the items 1 to 9, wherein the solvent (C) is a mixed solvent containing a solvent of the following Group A and at least one solvent selected from the following Groups B and C:

Group A: propylene glycol monomethyl ether acetate,
Group B: propylene glycol monomethyl ether, and ethyl lactate,
Group C: γ-butyrolactone, and propylene carbonate.

11. The positive resist composition as described in any one of the items 1 to 9, wherein the solvent (C) is a mixed solvent containing a solvent of the following Group D and at least one solvent selected from the following Groups E and F:

Group D: 2-heptanone,
Group E: propylene glycol monomethyl ether, ethyl lactate, and butyl acetate,
Group F: γ-butyrolactone, and propylene carbonate.

12. The positive resist composition as described in any one of the items 1 to 11, which further comprises (D) a surfactant.

13. The positive resist composition as described in any one of the items 1 to 12, which further comprises (E) an organic basic compound.

14. A pattern formation method comprising: forming a resist film from the positive resist composition described in any one of the items 1 to 13; irradiating electron beam, X-ray or EUV on said resist film; and developing said resist film with an alkali developer.

By using the positive resist composition of the present invention, a good pattern can be formed with good sensitivity and good resolution by the irradiation of actinic rays or radiation, particularly, electron beam, X-ray or EUV.

DETAILED DESCRIPTION OF THE INVENTION

The components for use in the present invention are described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

[1] (A) Resin of which Dissolution Rate in an Alkali Developer Increases by the Action of an Acid The resin (A) is a resin comprising a repeating unit represented by formula (I) and a repeating unit represented by formula (II), of which dissolution rate in an alkali developer increases by the action of an acid (acid-decomposable resin).

The repeating unit represented by formula (I) is described below.

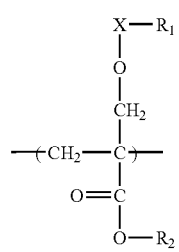

(I)

wherein $R_1$ represents a hydrogen atom or a hydrocarbon group, $R_2$ represents a hydrocarbon group, and X represents a single bond or a carbonyl group.

Examples of the hydrocarbon group of $R_1$ and $R_2$ include an alkyl group (preferably having from 1 to 20 carbon atoms) which may have a substituent, or a cycloalkyl group (preferably having from 3 to 20 carbon atoms) which may have a substituent. The alkyl group may have a heteroatom such as oxygen atom in its chain. Examples thereof include a methyl group, a linear or branched propyl group, a linear or branched butyl group, a linear or branched pentyl group, a linear, branched or cyclic hexyl group, adamantyl, norbornyl, butyrolactone, cyclohexane lactone and norbornane lactone.

Examples of the substituent which may be substituted to the alkyl group of $R_1$ and $R_2$ include a carboxylic acid group and an oxo group.

The monomer corresponding to the repeating unit represented by formula (I) can be synthesized, for example, starting from a corresponding acryl compound by the method described in *Adhesion Technology, Japan*, Vol. 14, No. 4, Consecutive Volume No. 37, page 2, The Adhesion Society of Japan (1995).

Specific examples of the repeating unit represented by formula (I) are set forth below, but the present invention is not limited thereto.

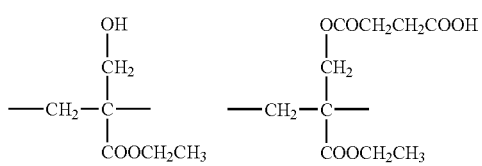

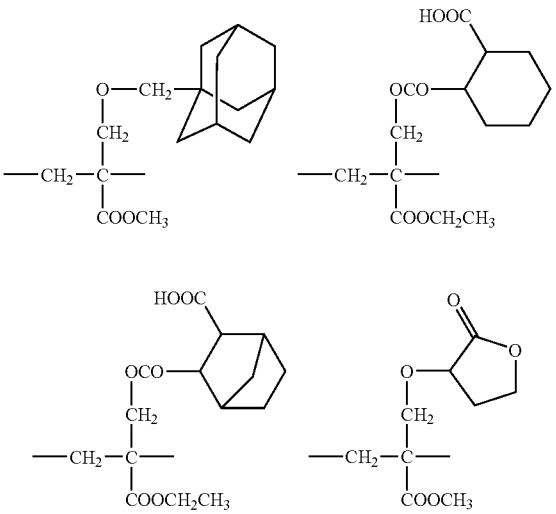

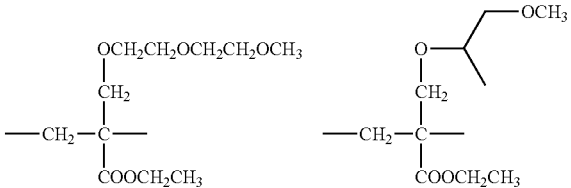

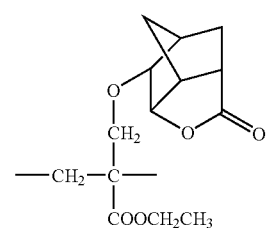

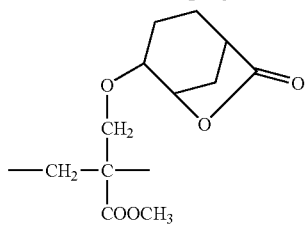

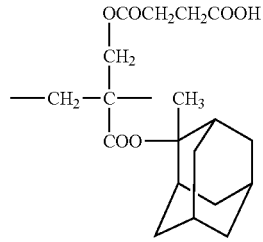

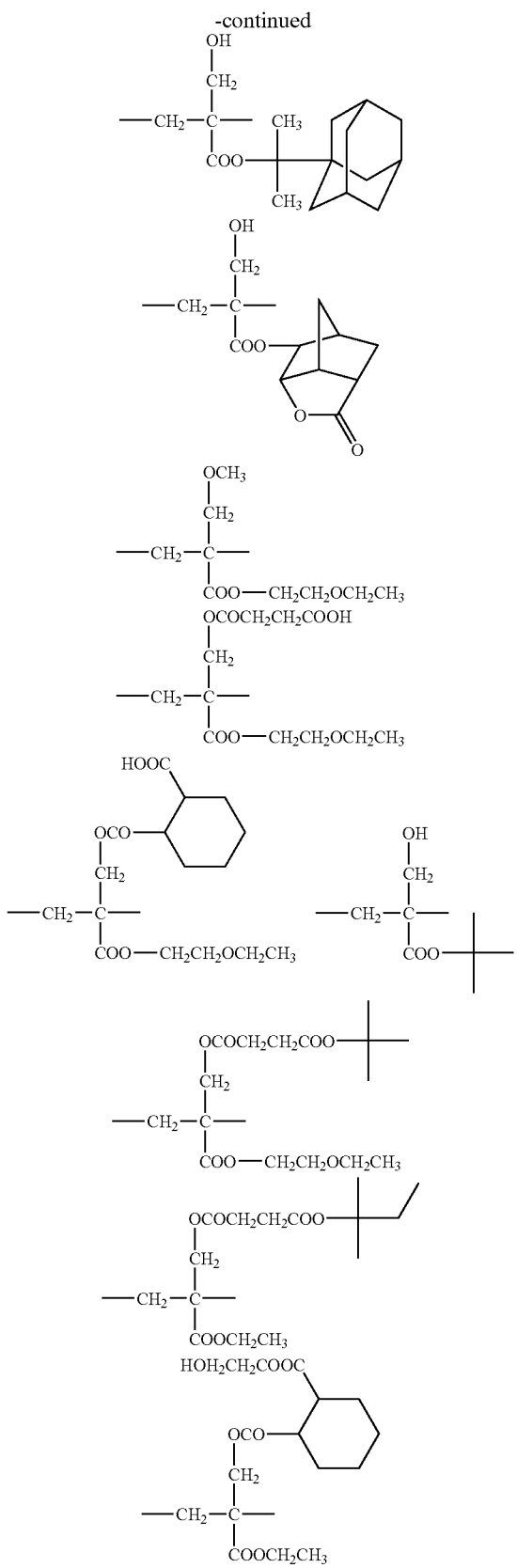

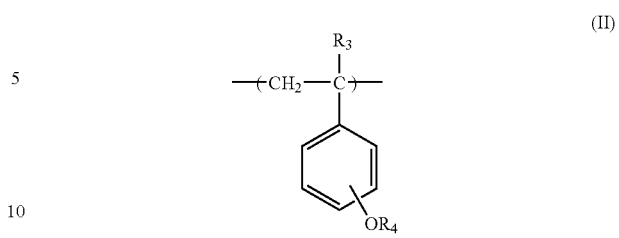

wherein $R_3$ represents a hydrogen tom, a methyl group or a halogen atom, and $R_4$ represents a hydrogen atom or a hydrocarbon group which may have a heteroatom. The substitution position of —$OR_4$ is preferably the para-position.

The hydrocarbon group of $R_4$, which may have a heteroatom, is preferably a hydrocarbon group having from 1 to 10 carbon atoms and examples thereof include an alkyl group, a cycloalkyl group, an aralkyl group, an aryl group, an acyl group, an acyloxy group, an alkylsulfonyl group and an arylsulfonyl group.

The resin (A) is a resin of which dissolution rate in an alkali developer increases by the action of an acid, and contains a group capable of decomposing by the action of an acid and becoming alkali-soluble (acid-decomposable group). This acid-decomposable group is present at least in either one of the repeating unit of formula (I) and the repeating unit of formula (II) but may be additionally contained in other repeating units.

In the case where the repeating unit of formula (I) contains the acid-decomposable group, the hydrocarbon group of $R_2$ constitutes the acid-decomposable group in the form of $COOR_2$ in formula (I).

In the case where the repeating unit of formula (II) contains the acid-decomposable group, the hydrocarbon group of $R_4$ constitutes the acid-decomposable group in the form of $OR_4$ in formula (I).

Examples of such an acid-decomposable group include groups represented by —COOA$^0$ and —O—B$^0$, and examples of the group containing such a group include groups represented by —R$^0$—COOA$^0$ and —Ar—O—B$^0$.

In these formulae, A$^0$ represents —C(R$^{01}$)(R$^{02}$)(R$^{03}$), —Si(R$^{01}$)(R$^{02}$)R$^{03}$), —C(R$^{04}$)(R$^{05}$)—O—R$^{06}$ or a lactone group, and B$^0$ represents —A$^0$ or —CO—O—A$^0$.

R$^{01}$, R$^{02}$, R$^{03}$, R$_{04}$ and R$^{05}$, which may be the same or different, each represents a hydrogen atom, an alkyl group, a cycloalkyl group, an alkenyl group, an aralkyl group or an aryl group, R$^{06}$ represents an alkyl group, a cyclic alkyl group or an aryl group, provided that at least two of R$^{01}$ to R$^{03}$ and at least two of R$^{04}$ to R$^{06}$ are a group other than a hydrogen atom and that two groups out of R$^{01}$ to R$^{03}$ and out of R$^{04}$ to R$^{06}$ may combine to form a ring, R$^0$ represents a single bond or a divalent or greater valent aliphatic or aromatic hydrocarbon group which may have a substituent, and —Ar— represents a monocyclic or polycyclic divalent or greater valent aromatic group which may have a substituent.

Here, the alkyl group is preferably an alkyl group having from 1 to 4 carbon atoms, such as methyl group, ethyl group, propyl group, n-butyl group, sec-butyl group and tert-butyl group, the cycloalkyl group is preferably a cycloalkyl group having from 3 to 30 carbon atoms, such as cyclopropyl group, cyclobutyl group, cyclohexyl group and adamantyl group, the alkenyl group is preferably an alkenyl group The resin (A) also contains a repeating unit represented by formula (II):

having from 2 to 4 carbon atoms, such as vinyl group, propenyl group, allyl group and butenyl group, and the aryl group is preferably an aryl group having from 6 to 14 carbon atoms, such as phenyl group, xylyl group, toluyl group, cumenyl group, naphthyl group and anthracenyl group. The cyclic alkyl group is preferably a cyclic alkyl group having from 3 to 30 carbon atoms and specific examples thereof include a cyclopropyl group, a cyclopentyl group, a cyclohexyl group, an adamantyl group, a norbornyl group, a boronyl group, a tricyclodecanyl group, a dicyclopentenyl group, a norbornene epoxy group, a menthyl group, an isomenthyl group, a neomenthyl group, a tetracyclodecanyl group and a steroid residue. The aralkyl group includes an aralkyl group having from 7 to 20 carbon atoms and may have a substituent. Examples of the aralkyl group include a benzyl group, a phenethyl group and a cumyl group.

Examples of the substituent include a hydroxyl group, a halogen atom (e.g., fluorine, chlorine, bromine, iodine), a nitro group, a cyano group, the above-described alkyl group, an alkoxy group (e.g., methoxy, ethoxy, hydroxyethoxy, propoxy, hydroxypropoxy, n-butoxy, isobutoxy, sec-butoxy, tert-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cinnamoyl, valeryl), an acyloxy group (e.g., butyryloxy), the above-described alkenyl group, an alkenyloxy group (e.g., vinyloxy, propenyloxy, allyloxy, butenyloxy), the above-described aryl group, an aryloxy group (e.g., phenoxy), and an aryloxycarbonyl group (e.g., benzoyloxy).

The lactone group includes those having the following structures:

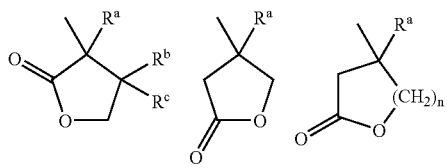

wherein $R^a$, $R^b$ and $R^c$ each independently represents a hydrogen atom or an alkyl group having from 1 to 4 carbon atoms, and n represents an integer of 2 to 4.

In the case where $R_2$ in formula (I) constitutes an acid-decomposable group in the form of $COOR_2$, $R_2$ is preferably any one of the following formulae (pI) to (pV):

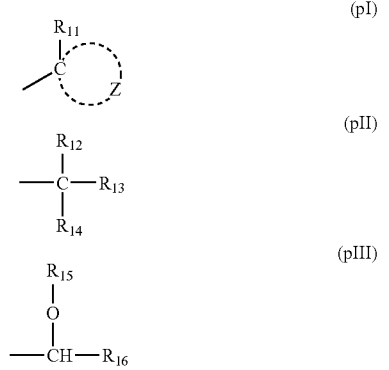

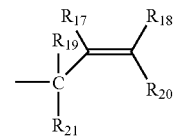

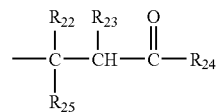

wherein $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents a linear or branched alkyl group having from 1 to 4 carbon atoms or an alicyclic hydrocarbon group, provided that at least one of $R_{12}$ to $R_{14}$ and either one of $R_{15}$ and $R_{16}$ represent an alicyclic hydrocarbon group, $R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pV), the alkyl group of $R_{12}$ to $R_{25}$ is a linear or branched alkyl group having from 1 to 4 carbon atoms, which may be substituted or unsubstituted, such as methyl group, ethyl group, n-propyl group, isopropyl group, n-butyl group, isobutyl group, sec-butyl group and tert-butyl group.

Examples of the substituent which may be substituted to the alkyl group include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$ to $R_{25}$ and the alicyclic hydrocarbon group formed by Z and the carbon atom may be monocyclic or polycyclic. Specific examples thereof include a group having 5 or more carbon atoms and having a monocyclic, bicyclic, tricyclic or tetracyclic structure. The number of carbon atoms in the group is preferably from 6 to 30, more preferably from 7 to 25. These alicyclic hydrocarbon groups each may have a substituent.

Examples of the structure of the alicyclic moiety in the alicyclic hydrocarbon group are set forth below.

-continued
(2)
(3)
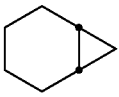
(4)
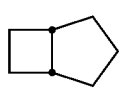
(5)
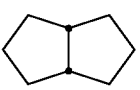
(6)
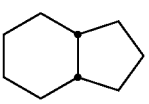
(7)
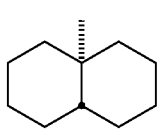
(8)
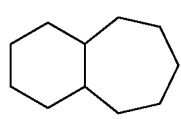
(9)
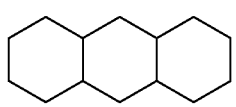
(10)
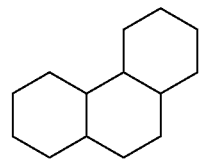
(11)
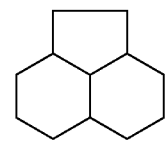
(12)
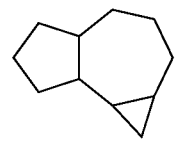
(13)
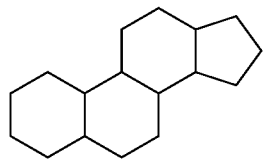
-continued
(14)
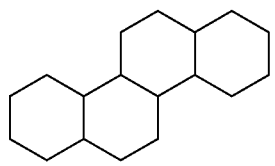
(15)
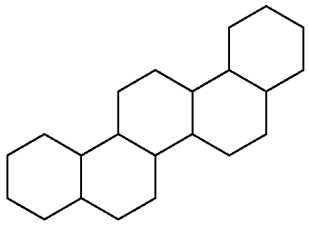
(16)
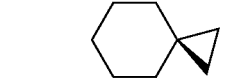
(17)
(18)
(19)
(20)
(21)
(22)
(23)
(24)
(25)
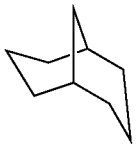

-continued
(26) 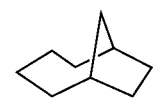
(27) 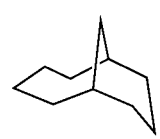
(28) 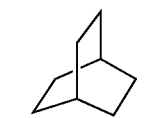
(29) 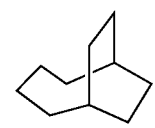
(30) 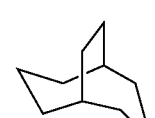
(31) 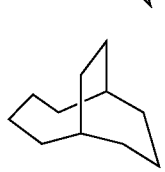
(32) 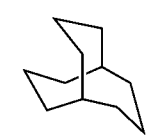
(33) 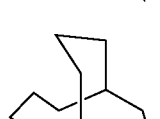
(34) 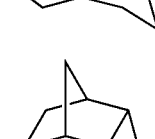
(35) 
(36) 
(37) 
-continued
(38) 
(39) 
(40) 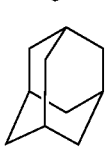
(41) 
(42) 
(43) 
(44) 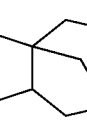
(45) 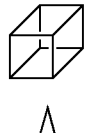
(46) 
(47) 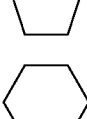
(48) 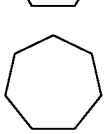
(49) 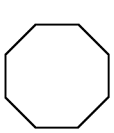
(50) 
Among these alicyclic moieties, preferred in the present invention are an adamantyl group, a noradamantyl group, a decalin residue, a tricyclodecanyl group, a tetracyclodecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group, a cyclododecanyl group and a tricyclodecanyl group.

Examples of the substituent of the alicyclic hydrocarbon group include an alkyl group, a halogen atom, a hydroxyl group, an alkoxy group, a carboxyl group and an alkoxycarbonyl group.

The alkyl group is preferably a lower alkyl group such as methyl group, ethyl group, propyl group, isopropyl group and butyl group, more preferably an alkyl group selected from the group consisting of a methyl group, an ethyl group, a propyl group and an isopropyl group.

Examples of the substituent of the substituted alkyl group include a hydroxyl group, a halogen atom and an alkoxy group.

The alkoxy group includes an alkoxy group having from 1 to 4 carbon atoms, such as methoxy group, ethoxy group, propoxy group and butoxy group.

In the case where the hydrocarbon group of $R_4$ in formula (II), which may have a heteroatom, constitutes an acid-decomposable group in the form of —$OR_4$, $R_4$ is preferably a tertiary alkoxycarbonyl group (preferably having from 5 to 14 carbon atoms), a tertiary alkoxycarbonylalkyl group (preferably having from 6 to 15 carbon atoms) or a tertiary alkyl group (preferably having from 4 to 13 carbon atoms), or a group represented by the following formula (A) or (B).

The group represented by formula (A) is described below.

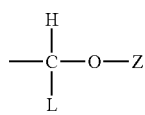

(A)

wherein L represents a hydrogen atom, an alkyl group, a cycloalkyl group or an aralkyl group, Z represents an alkyl group, a cycloalkyl group, an aralkyl group or an aryl group, and Z and L may combine with each other to form a 5- or 6-membered ring.

The alkyl group and cycloalkyl group of L and Z in the formula above each may have a substituent and is preferably a linear, branched or cyclic alkyl or cycloalkyl group having from 1 to 20 carbon atoms, such as methyl group, ethyl group, propyl group, isopropyl group, n-butyl group, isobutyl group, tert-butyl group, pentyl group, cyclopentyl group, hexyl group, cyclohexyl group, octyl group, dodecyl group and adamantyl group.

Preferred examples of the substituent which can be substituted to the alkyl group or cycloalkyl group of L and Z include a hydroxyl group, a halogen atom, a nitro group, a cycloalkyl group and a heterocyclic residue such as a pyrrolidone residue. Also, examples of the substituent which can be substituted to the cyclic structure in the cycloalkyl group of L and Z include an alkyl group. A substituent having 12 or less carbon atoms is preferred.

Examples of the aralkyl group of L and Z in formula (A) include an aralkyl group having from 7 to 15 carbon atoms, such as substituted or unsubstituted benzyl group and substituted or unsubstituted phenethyl group.

Examples of the aryl group of Z in formula (A) preferably include an aryl group having from 6 to 14 carbon atoms, such as a phenyl group, naphthyl group or anthryl group.

Preferred examples of the substituent, where the aralkyl group and aryl group may have, include a hydroxyl group, a halogen atom, a nitro group, and a cycloalkyl group. Examples of the aralkyl group having a substituent include a hydroxybenzyl group. The number of carbon atoms contained in the substituent which can be substituted to the aralkyl group of L or Z and the aryl group of Z is preferably 12 or less.

Z preferably has a cyclic carbon structure, and preferably represents a cycloalkyl group, an aralkyl group, an aryl group, or an alkyl group having a cyclic carbon structure as a substituent, and more preferably represents a cycloalkyl group, an aralkyl group, or an alkyl group having a cyclic carbon structure as a substituent.

Examples of the 5- or 6-membered ring formed when Z and L combine with each other include a tetrahydropyran ring and a tetrahydrofuran ring.

Specific examples of the group represented by formula (A) are set forth below, but the present invention is not limited thereto.

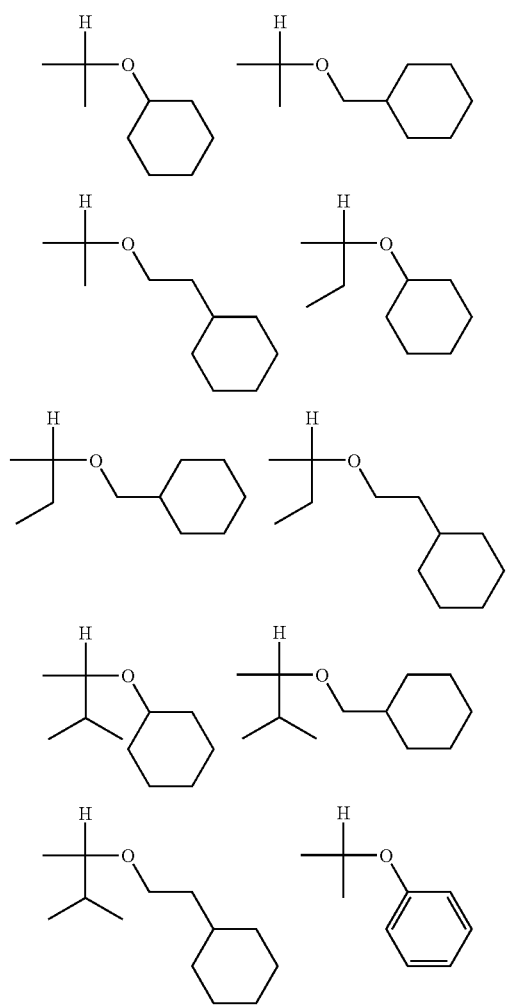

-continued

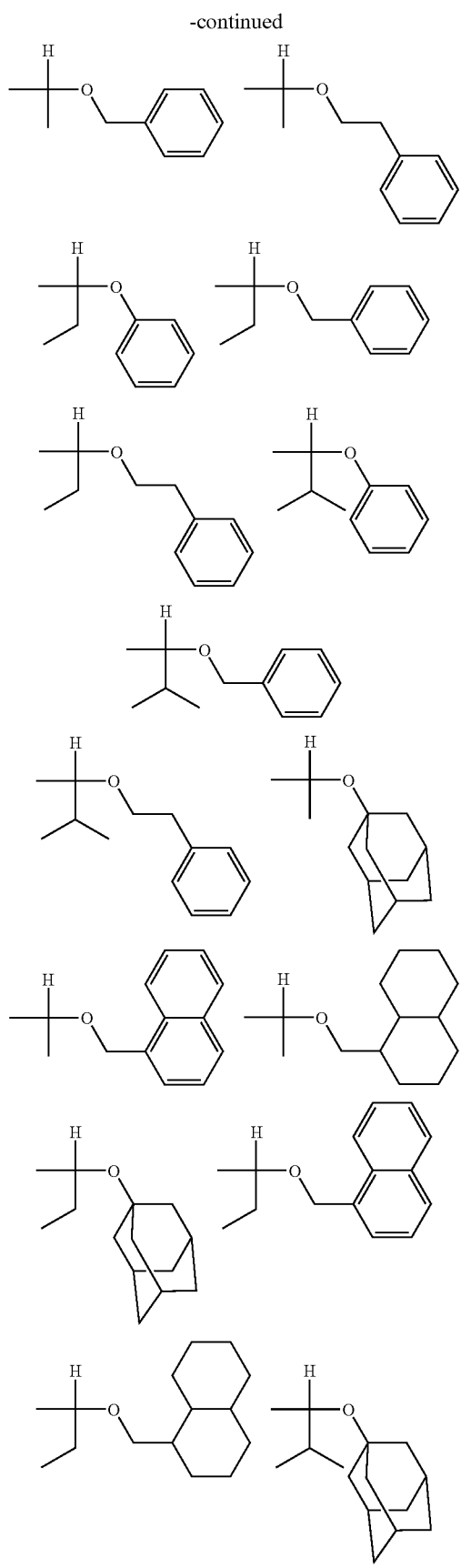

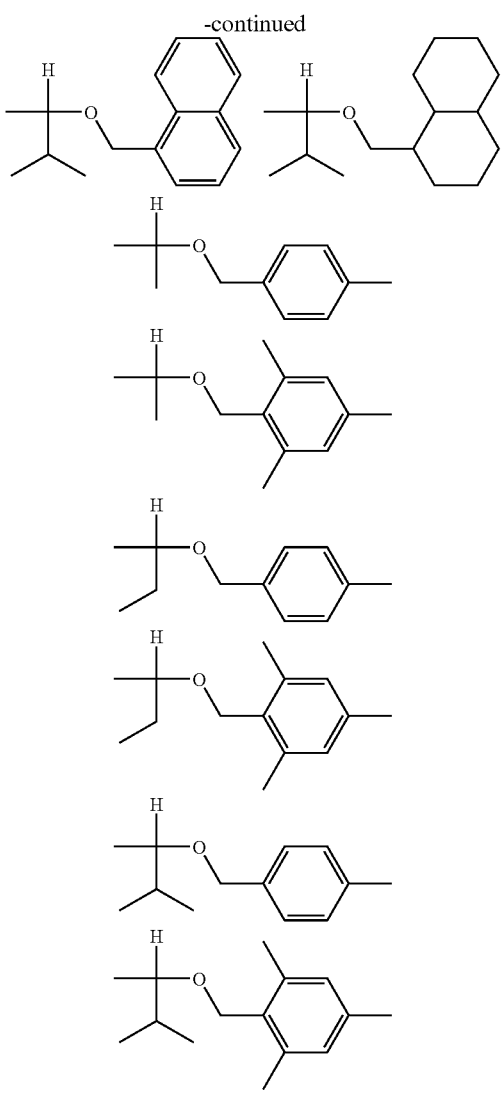

The group represented by formula (B) is described below.

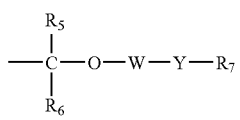

(B)

wherein $R_5$ and $R_6$ each independently represents a hydrogen atom or an alkyl group, $R_7$ represents an alkyl group, a cycloalkyl group, an aryl group or an aralkyl group, W represents a single bond or a divalent organic group, and Y represents a single bond, —O—, —CO$_2$—, —OCO—, —CO—, —S— or —SO$_2$—.

In formula (B), preferably, $R_5$ and $R_6$, which may be the same or different, each represents a hydrogen atom or an alkyl group having from 1 to 4 carbon atoms, W represents a divalent organic group, $R_7$ represents a chained alkyl group having a total carbon number of 11 to 20, which may have a substituent, a cyclic alkyl group having a total carbon number of 11 to 20, which may have a substituent, an aryl group having a total carbon number of 11 to 30, which may have a substituent, or an aralkyl group having a total carbon number of 12 to 30, which may have a substituent.

Specific examples of the alkyl group of $R_5$ and $R_6$ in formula (B) include an alkyl group having from 1 to 4 carbon atoms, such as methyl group, ethyl group, n-propyl group, isopropyl group, n-butyl group, isobutyl group, sec-butyl group and tert-butyl group.

Preferred examples of the divalent organic group of W include a linear, branched or cyclic alkylene group which may have a substituent, an arylene group which may have a substituent, a heteroarylene group which may have a substituent, an aralkylene group which may have a substituent, —S—, —C(=O)—, —N($R_8$)—, —SO—, —$SO_2$—, —$CO_2$—, —N($R_8$)$SO_2$— and a divalent group resulting from combining two or more of these groups. Here, $R_8$ represents a hydrogen atom or an alkyl group (specific examples of the alkyl group are the same as those described above for $R_5$). The number of the carbon atom in the divalent organic group of W is preferably 10 or less, more preferably 8 or less, and still more preferably 6 or less.

$R_7$ is an alkyl group which may have a substituent, a cycloalkyl group which may have a substituent, an aryl group which may have a substituent, or an aralkyl group which may have a substituent.

The alkyl group is preferably an alkyl group having a total carbon number of, including the substituent, from 1 to 20, more preferably from 11 to 20, still more preferably 11 to 18, and may be linear or branched. Examples thereof include a methyl group, an ethyl group, an n-propyl group, an i-propyl group, an n-butyl group, an i-butyl group, a tert-butyl group, an n-pentyl group, an i-pentyl group, a tert-pentyl group, an n-hexyl group, an i-hexyl group, a tert-hexyl group, an n-heptyl group, an i-heptyl group, a tert-heptyl group, an n-octyl group, an i-octyl group, a tert-octyl group, an n-nonyl group, an i-nonyl group, a tert-nonyl group, an n-decyl group, an i-decyl group, a tert-decyl group, an n-undecyl group, an i-undecyl group, an n-dodecyl group, an i-dodecyl group, an n-tridecyl group, an i-tridecyl group, an n-tetradecyl group, an i-tetradecyl group, an n-pentadecyl group, an i-pentadecyl group, an n-hexadecyl group, an i-hexadecyl group, an n-heptadecyl group, an i-heptadecyl group, an n-octadecyl group, an i-octadecyl group, an n-nonadecyl group and an i-nonadecyl group.

The cycloalkyl group is preferably a cycloalkyl group having a total carbon number of, including the substituent, from 1 to 20, more preferably from 11 to 20, still more preferably from 11 to 18, and may a cycloalkyl group in which the rig is formed by up to 20 carbon atoms, or a cyclic alkyl having a substituent. Examples thereof include a cyclopropyl group, a cyclobutyl group, a cyclopentyl group, a cyclohexyl group, a cycloheptyl group, a cyclooctyl group, a cyclononyl group, a cyclodecyl group, a cycloundecyl group, a cyclododecyl group, a cyclotridecyl group, a cyclotridecyl group, a cyclotetradecyl group, a cyclopentadecyl group, a cyclohexadecyl group, a cycloheptadecyl group, a cyclooctadecyl group, a cyclononadecyl group, a 4-cyclohexylcyclohexyl group, a 4-n-hexylcyclohexyl group, a pentanylcyclohexyl group, a hexyloxycyclohexyl group and a pentanyloxycyclohexyl group. Substituted cyclic alkyl groups other than those described here may also be used if the above-described range is satisfied.

The aryl group of $R_7$ is preferably an aryl group having a total carbon number of, including the substituent, from 1 to 30, more preferably from 11 to 30, still more preferably from 11 to 25, and examples thereof include a phenyl group, a tolyl group, a xylyl group, an ethylphenyl group, a propylphenyl group, a methoxyphenyl group, an ethoxyphenyl group, a propyloxyphenyl group, a 4-cyclopentylphenyl group, a 4-cyclohexylphenyl group, a 4-cycloheptenylphenyl group, a 4-cyclooctanylphenyl group, a 2-cyclopentylphenyl group, a 2-cyclohexylphenyl group, a 2-cycloheptenylphenyl group, a 2-cyclooctanylphenyl group, a 3-cyclopentylphenyl group, a 3-cyclohexylphenyl group, a 3-cycloheptenylphenyl group, a 3-cyclooctanylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentylphenyl group, a 4-n-hexylphenyl group, a 4-n-heptenylphenyl group, a 4-n-octanylphenyl group, a 2-n-pentylphenyl group, a 2-n-hexylphenyl group, a 2-n-heptenylphenyl group, a 2-n-octanylphenyl group, a 3-n-pentylphenyl group, a 3-n-hexylphenyl group, a 3-n-heptenylphenyl group, a 3-n-octanylphenyl group, a 2,6-di-isopropylphenyl group, a 2,3-di-isopropylphenyl group, a 2,4-di-isopropylphenyl group, a 3,4-di-isopropylphenyl group, a 3,6-di-tert-butylphenyl group, a 2,3-di-tert-butylphenyl group, a 2,4-di-tert-butylphenyl group, a 3,4-ditert-butylphenyl group, a 2,6-di-n-butylphenyl group, a 2,3-di-n-butylphenyl group, a 2,4-di-n-butylphenyl group, a 3,4-di-n-butylphenyl group, a 2,6-di-i-butylphenyl group, a 2,3-di-i-butylphenyl group, a 2,4-di-i-butylphenyl group, a 3,4-di-i-butylphenyl group, a 2,6-di-tert-amylphenyl group, a 2,3-di-tert-amylphenyl group, a 2,4-di-tert-amylphenyl group, a 3,4-di-tert-amylphenyl group, a 2,6-di-i-amylphenyl group, a 2,3-di-i-amylphenyl group, a 2,4-di-i-amylphenyl group, a 3,4-di-i-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isoboronylphenyl group, a 3-isoboronylphenyl group, a 2-isoboronylphenyl group, a 4-yclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentyloxyphenyl group, a 4-n-hexyloxyphenyl group, a 4-n-heptenyloxyphenyl group, a 4-n-octanyloxyphenyl group, a 2-n-pentyloxyphenyl group, a 2-n-hexyloxyphenyl group, a 2-n-heptenyloxyphenyl group, a 2-n-octanyloxyphenyl group, a 3-n-pentyloxyphenyl group, a 3-n-hexyloxphenyl group, a 3-n-heptenyloxyphenyl group, a 3-n-octanyloxyphenyl group, a 2,6-di-isopropyloxyphenyl group, a 2,3-di-isopropyloxyphenyl group, a 2,4-di-isopropyloxyphenyl group, a 3,4-di-isopropyloxyphenyl group, a 2,6-di-tert-butyloxyphenyl group, a 2,3-di-tert-butyloxyphenyl group, a 2,4-di-tert-butyloxyphenyl group, a 3,4-di-tert-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-i-butyloxyphenyl group, a 2,3-di-i-butyloxyphenyl group, a 2,4-di-i-butyloxyphenyl group, a 3,4-di-i-butyloxyphenyl group, a 2,6-di-tert-amyloxyphenyl group, a 2,3-di-tert-amyloxyphenyl group, a 2,4-di-tert-amyloxyphenyl group, a 3,4-di-tert-amyloxyphenyl group, a 2,6-di-i-amyloxyphenyl group, a 2,3-di-i-amyloxyphenyl group, a 2,4-di-i-amyloxyphenyl group, a 3,4-di-i-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isoboronyloxyphenyl group, a 3-isoboronyloxyphenyl group and a 2-isoboronyloxyphenyl group. These groups each may be further substituted within the above-described range and the substituent is not limited to the substituents other than those described above.

The aralkyl group of $R_7$ is preferably an aralkyl group having a total carbon number of, including the substituent, from 2 to 30, more preferably from 12 to 30, still more preferably from 12 to 25, and examples thereof include a phenylethyl group, a triphenylethyl group, a xylylphenylethyl group, an ethylphenylethyl group, a propylphenylethyl group, a 4-cyclopentylphenylethyl group, a 4-cyclohexylphenylethyl group, a 4-cycloheptenylphenylethyl group, a 4-cyclooctanylphenylethyl group, a 2-cyclopentylphenylethyl group, a 2-cyclohexylphenylethyl group, 2-cycloheptenylphenylethyl group, a 2-cyclooctanylphenylethyl group, a 3-cyclopentylphenylethyl group, a 3-cyclohexylphenylethyl group, a 3-cycloheptenylphenylethyl group, a 3-cyclooctanylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxyphenylethyl group, a 3-cyclopentyloxyphenylethyl group, a 3-cyclohexyloxyphenylethyl group, a 3-cycloheptenyloxy-phenylethyl group, a 3-cyclooctanyloxyphenylethyl group, a 4-n-pentylphenylethyl group, a 4-n-hexylphenylethyl group, a 4-n-heptenylphenylethyl group, a 4-n-octanylphenylethyl group, a 2-n-pentylphenylethyl group, a 2-n-hexylphenylethyl group, a 2-n-heptenylphenylethyl group, a 2-n-octanylphenylethyl group, a 3-n-pentylphenylethyl group, a 3-n-hexylphenylethyl group, a 3-n-heptenylphenylethyl group, a 3-n-octanylphenylethyl group, a 2,6-di-isopropylphenylethyl group, a 2,3-di-isopropylphenylethyl group, a 2,4-di-isopropylphenylethyl group, a 3,4-di-isopropylphenylethyl group, a 2,6-di-tert-butylphenylethyl group, a 2,3-di-tert-butylphenylethyl group, a 2,4-di-tert-butylphenylethyl group, a 3,4-di-tert-butylphenylethyl group, a 2,6-di-n-butylphenylethyl group, a 2,3-di-n-butylphenylethyl group, a 2,4-di-n-butylphenylethyl group, a 3,4-di-n-butylphenylethyl group, a 2,6-di-i-butylphenylethyl group, a 2,3-di-i-butylphenylethyl group, a 2,4-di-i-butylphenylethyl group, a 3,4-di-i-butylphenylethyl group, a 2,6-di-tert-amylphenylethyl group, a 2,3-di-tert-amylphenylethyl group, a 2,4-di-tert-amylphenylethyl group, a 3,4-di-tert-amylphenylethyl group, a 2,6-di-i-amylphenylethyl group, a 2,3-di-i-amylphenylethyl group, a 2,4-di-i-anylphenylethyl group, a 3,4-di-i-amylphenyletliyl group, a 2,6-di-n-pentylphelylethyl group, a 2,3-di-n-pentylphenylethyl group, a 2,4-di-n-pentylphenyletlhyl group, a 3,4-di-n-pentylphenylethyl group, a 4-adamantylphenylethyl group, a 3-adanmantylphenylethyl group, a 2-adamantylphenylethyl group, a 4-isoboronylphenyletlhyl group, a 3-isoboronylphenyletlhyl group, a 2-isoboronylphenyletlhyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptanyloxyphenylethyl group, a 2-cyclooctanyloxyphenylethyl group, a 3-cyclopentyloxyphenylethyl group, a 3-cyclohexyloxyphenylethyl group, a 3-cycloheptenyloxyphenylethyl group, a 3-cyclooctanyloxyphenylethyl group, a 4-n-pentyloxyphenylethyl group, a 4-n-hexyloxyphenylethyl group, a 4-n-heptenyloxyphenyl group, a 4-n-octanyloxyphenylethyl group, a 2-n-pentyloxyphenylethyl group, a 2-n-hexyloxyphenylethyl group, a 2-n-heptenyloxyphenylethyl group, a 2-n-octanyloxyphenylethyl group, a 3-n-pentyloxyphenylethyl group, a 3-n-hexyloxyphenylethyl group, a 3-n-heptenyloxyphenylethyl group, a 3-n-octanyloxyphenylethyl group, a 2,6-di-isopropyloxyphenylethyl group, a 2,3-di-isopropyloxyphenylethyl group, a 2,4-di-isopropyloxyphenylethyl group, a 3,4-di-isopropyloxyphenylethyl group, a 2,6-di-tert-butyloxyphenyl group, a 2,3-di-tert-butyloxyphenylethyl group, a 2,4-di-tert-butyloxyphenylethyl group, a 3,4-di-tert-butyloxyphenylethyl group, a 2,6-di-n-butyloxyphenylethyl group, a 2,3-di-n-butyloxyphenylethyl group, a 2,4-di-n-butyloxyphenylethyl group, a 3,4-di-n-butyloxyphenylethyl group, a 2,6-di-i-butyloxyphenylethyl group, a 2,3-di-i-butyloxyphenylethyl group, a 2,4-di-i-butyloxyphenylethyl group, a 3,4-di-i-butyloxyphenylethyl group, a 2,6-di-tert-amyloxyphenylethyl group, a 2,3-di-tert-amyloxyphenylethyl group, a 2,4-di-tert-amyloxyphenylethyl group, a 3,4-di-tert-amyloxyphenylethyl group, a 2,6-di-i-amyloxyphenylethyl group, a 2,3-di-i-amyloxyphenylethyl group, a 2,4-di-i-amyloxyphenylethyl group, a 3,4-di-i-amyloxyphenylethyl 2,6-di-n-pentyloxyphenylethyl group, a 2,3-di-n-pentyloxyphenylethyl group, a 2,4-di-n-pentyloxyphenyl group, a 3,4-di-n-pentyloxyphenylethyl group, a 4-adamantyloxyphenylethyl group, a 3-adamantyloxyphenylethyl group, a 2-adamantyloxyphenylethyl group, a 4-isoboronyloxyphenylethyl group, a 3-isoboronyloxyphenylethyl group, a 2-isoboronyloxyphenylethyl group, and those where the hydrogen atom of the alkyl in the above is replaced by a methyl group, a propyl group, a butyl group or the like.

Examples of the substituent which is further substituted to the above-described groups include a hydroxyl group, a halogen atom (e.g., fluorine, chlorine, bromine, iodine), a nitro group, a cyano group, the above-described alkyl group, an alkoxy group (e.g., methoxy, ethoxy, hydroxyethoxy, propoxy, hydroxypropoxy, n-butoxy, isobutoxy, sec-butoxy, tert-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cyanamyl, valeryl), an acyloxy group (e.g., butyryloxy), the above-described alkenyl group, an akenyloxy group (e.g., vinyloxy, propenyloxy, allyloxy, butenyloxy), the above-described aryl group, an aryloxy group (e.g., phenoxy) and an aryloxycarbonyl group (e.g., benzoyloxy).

The substituent of $R_7$ is preferably an aryl group having from 11 to 25 carbon atoms, or an aralkyl group having from 12 to 25 carbon atoms. These substituents each may further have a substituent and the substituted aryl or aralkyl group may be satisfied if the total carbon number thereof is within the above-described range.

Specific examples of the group represented by formula (B) are set forth below, but the present invention is not limited thereto.

1.

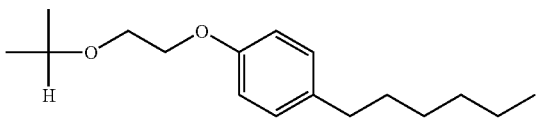

-continued
2.
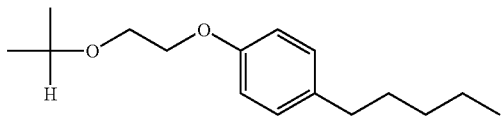
3.
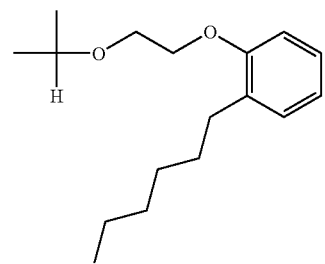
4.
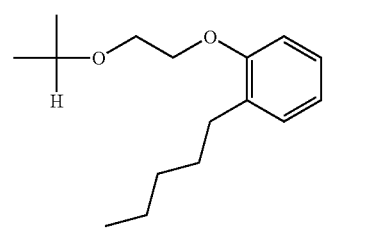
5.
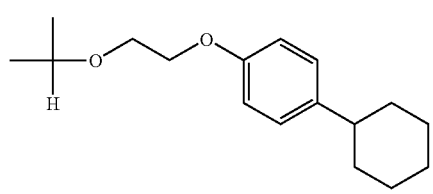
6.
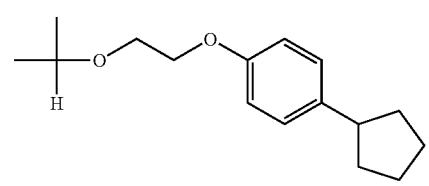
7.
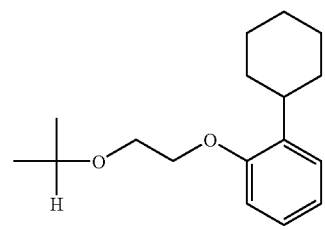
8.
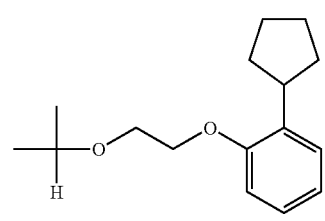
-continued
9.
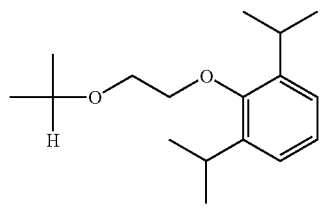
10.
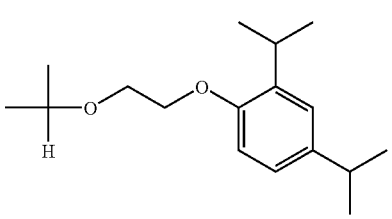
11.
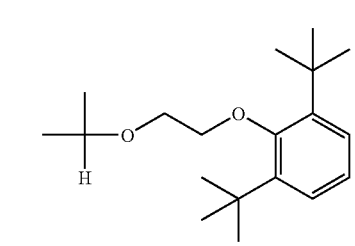
12.
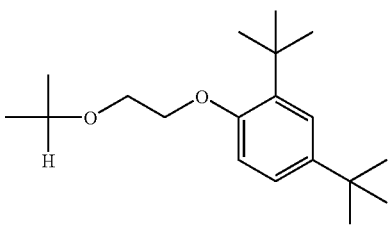
13.
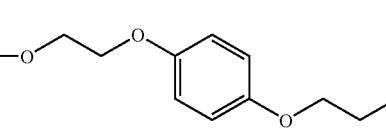
14.
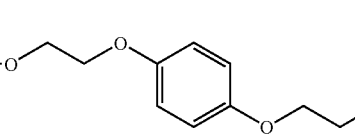
15.
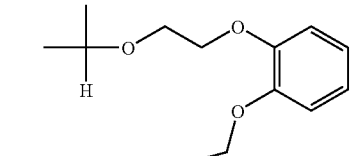
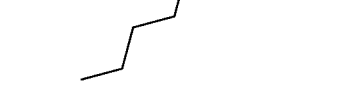

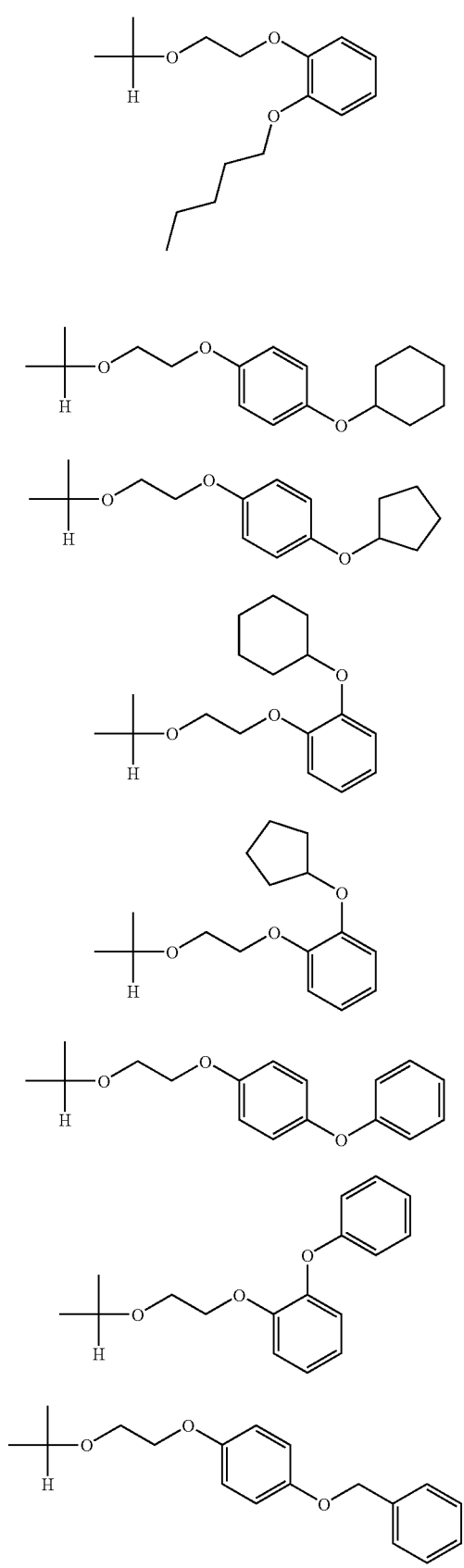
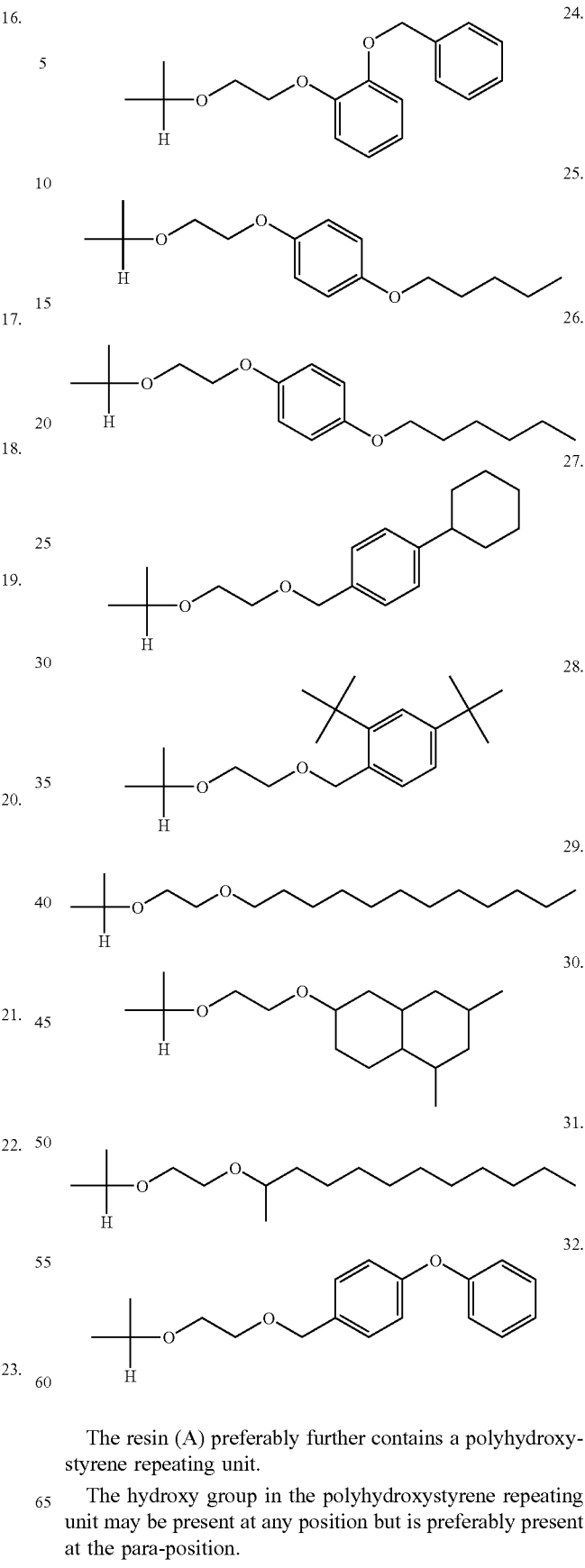
The resin (A) preferably further contains a polyhydroxystyrene repeating unit.
The hydroxy group in the polyhydroxystyrene repeating unit may be present at any position but is preferably present at the para-position.

In addition to the above-described repeating units, the resin (A) may comprise a repeating unit originated in a compound having an addition polymerizable unsaturated bond, such as acrylic esters, methacrylic esters, acrylamides, methacrylamides, allyl compounds, vinyl ethers and vinyl esters.

In the resin (A), the content of the repeating unit represented by formula (I) is preferably from 5 to 80 mol %, more preferably from 10 to 60 mol %, still more preferably from 20 to 50 mol %, based on all repeating units constituting the resin.

The content of the repeating unit represented by formula (II) is preferably from 5 to 90 mol %, more preferably from 10 to 80 mol %, still more preferably from 30 to 70 mol %, based on all repeating units constituting the resin.

The content of the polyhydroxystyrene repeating unit is preferably from 10 to 80 mol %, more preferably from 20 to 70 mol %, still more preferably from 30 to 70 mol %, based on all repeating units constituting the resin.

The content of the repeating unit having an acid-decomposable group is preferably from 10 to 60 mol %, more preferably from 20 to 55 mol %, still more preferably from 30 to 50 mol %, based on all repeating units constituting the resin.

When —COOR$_2$ in formula (I) is an acid-decomposable group, R$_4$ in formula (II) is preferably a hydrogen atom.

When —OR$_4$ in formula (II) is an acid-decomposable group, a polyhydroxystyrene repeating unit is preferably contained together with the repeating unit represented by formula (I).

The weight average molecular weight of the resin (A) can be measured as a polystyrene-reduced molecular weight (MW) by gel penetration chromatography (GPC) and is preferably from 2,000 to 1,000,000, more preferably from 3,000 to 100,000, still more preferably from 3,000 to 50,000. That is, the molecular weight is preferably 2,000 or more from the standpoint of preventing the film loss of the resist and preferably 1,000,000 or less in view of solubility and resolution.

The resin (A) can be synthesized by an ordinary method (for example, radical polymerization). For example, in a general synthesis method, monomer species are charged into a reaction vessel all at once or on the way of reaction and, if desired, dissolved in a reaction solvent such as tetrahydrofuran, 1,4-dioxane, ethers (e.g., diisopropyl ether), ketones (e.g., methyl ethyl ketone, methyl isobutyl ketone) and esters (e.g., ethyl acetate), or in a solvent capable of dissolving various monomers, such as propylene glycol monomethyl ether acetate which is described later. The obtained uniform solution is, if desired, heated in an inert gas atmosphere such as nitrogen or argon, and the polymerization is started by using a commercially available radical initiator (e.g., azo-based initiator, peroxide). If desired, the initiator is added additionally or in parts. After the completion of reaction, the reactant is charged into a solvent and the desired polymer is recovered, for example, by a powder or solid recovery method. The reaction concentration is 20 mass % or more, preferably 30 mass % or more, more preferably 40 mass % or more, and the reaction temperature is from 10 to 150° C., preferably from 30 to 120° C., more preferably from 50 to 100° C.

The amount of the resin blended is, as a total amount, preferably from 40 to 99.99 mass %, more preferably from 50 to 99.97 mass %, based on the entire solid content of the composition.

Specific examples of the resin (A) are set forth below, but the present invention is not limited thereto.

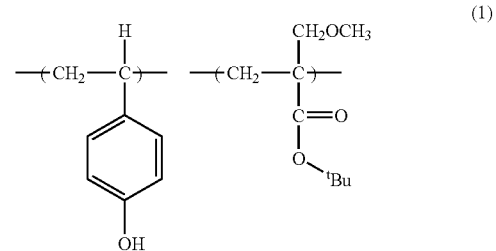

(1)

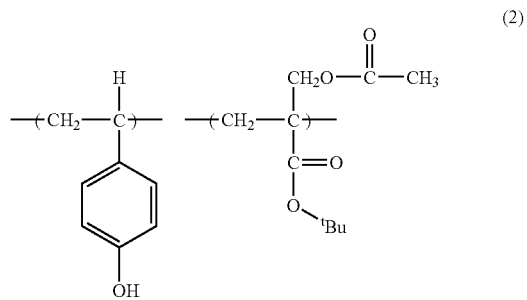

(2)

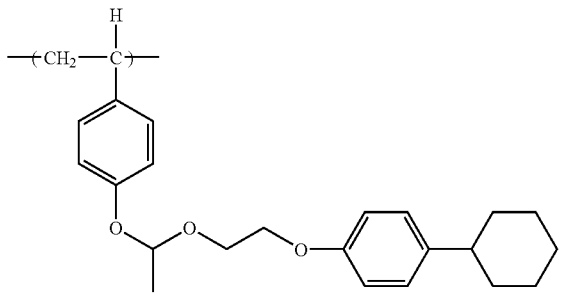

(3)

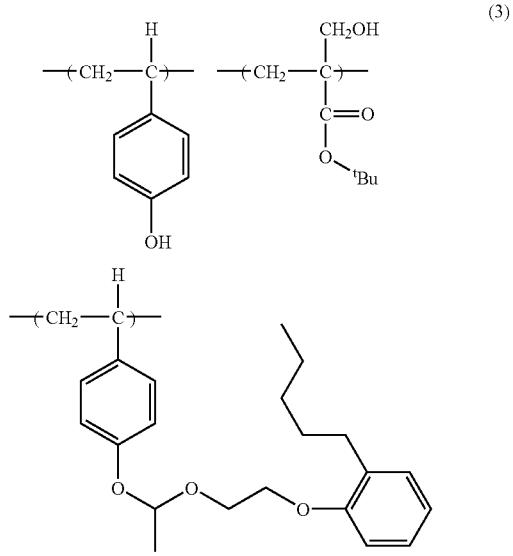

(4)

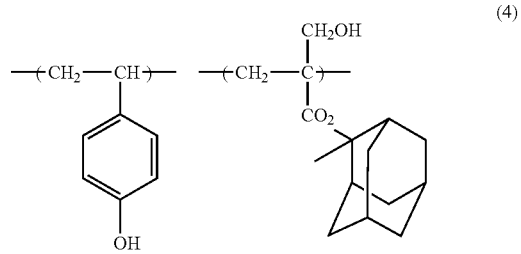

-continued
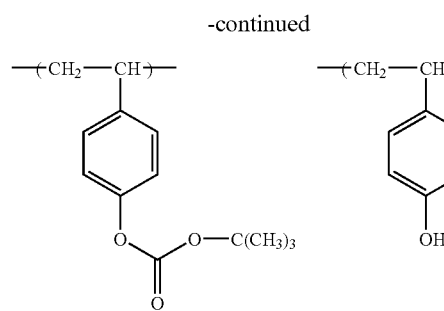 (5)
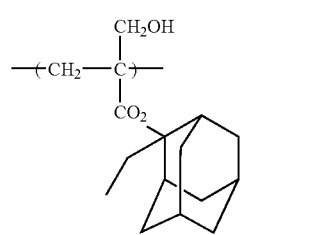
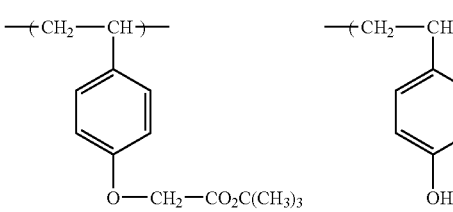 (6)
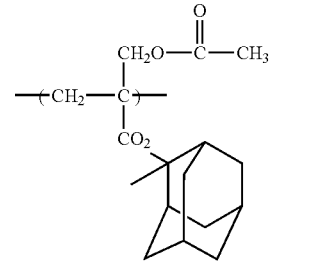
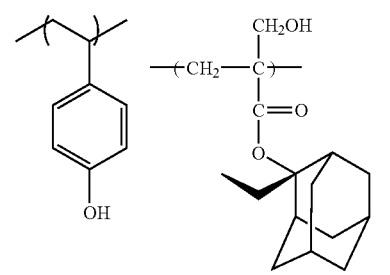 (7)
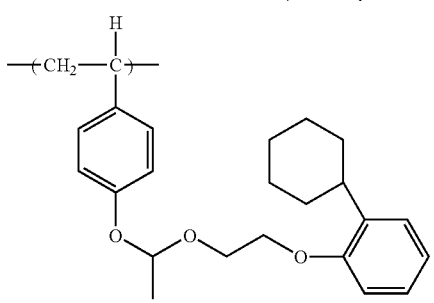
-continued
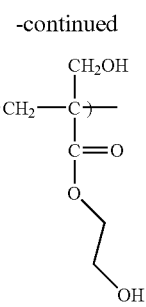 (8)
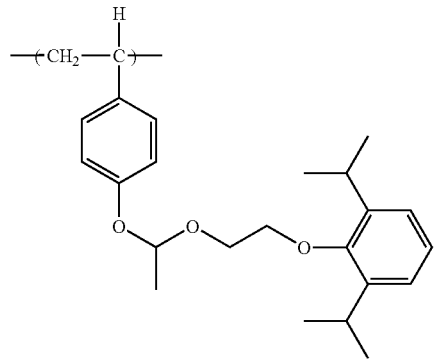
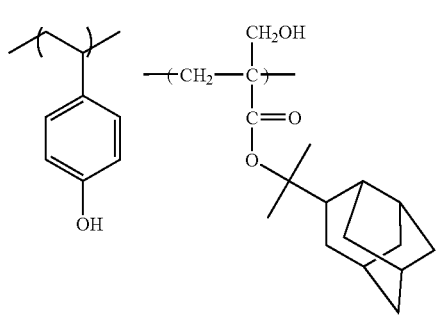 (9)
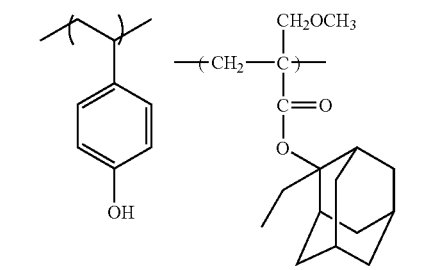 (10)
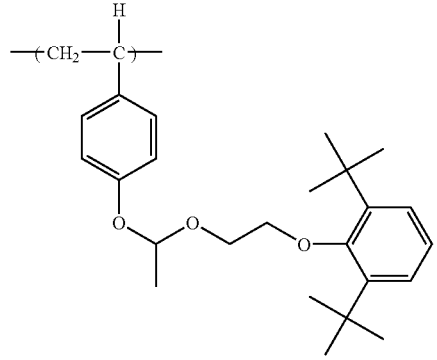

-continued
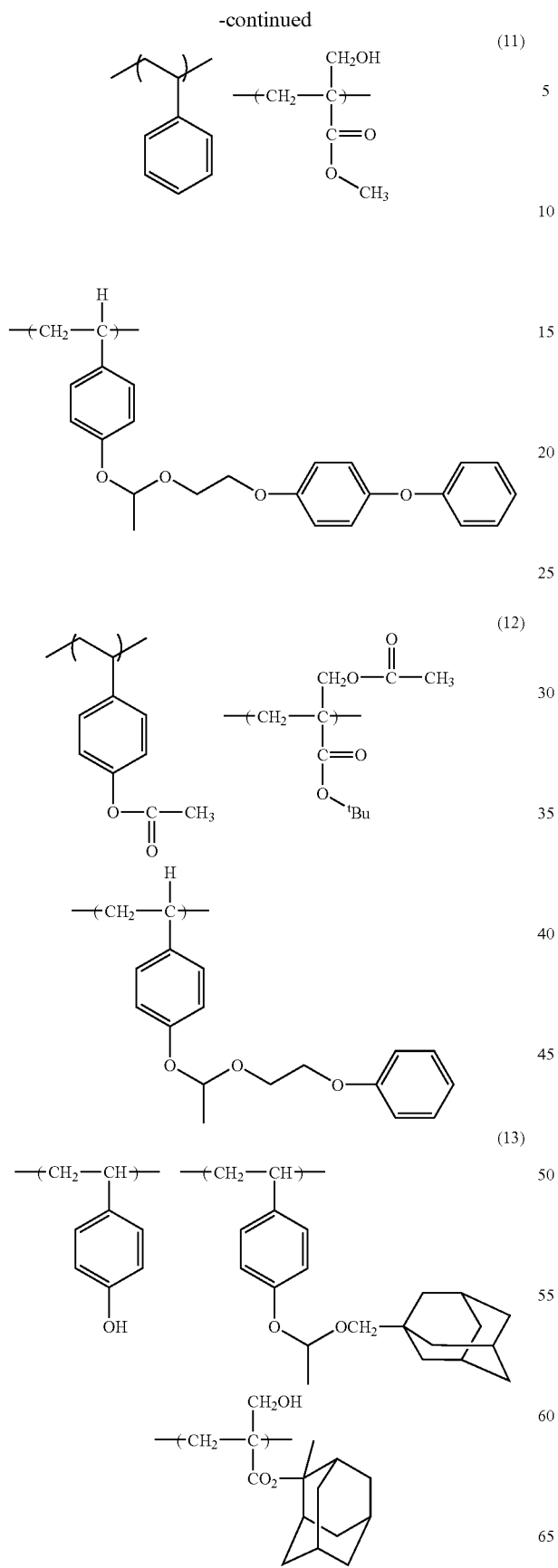
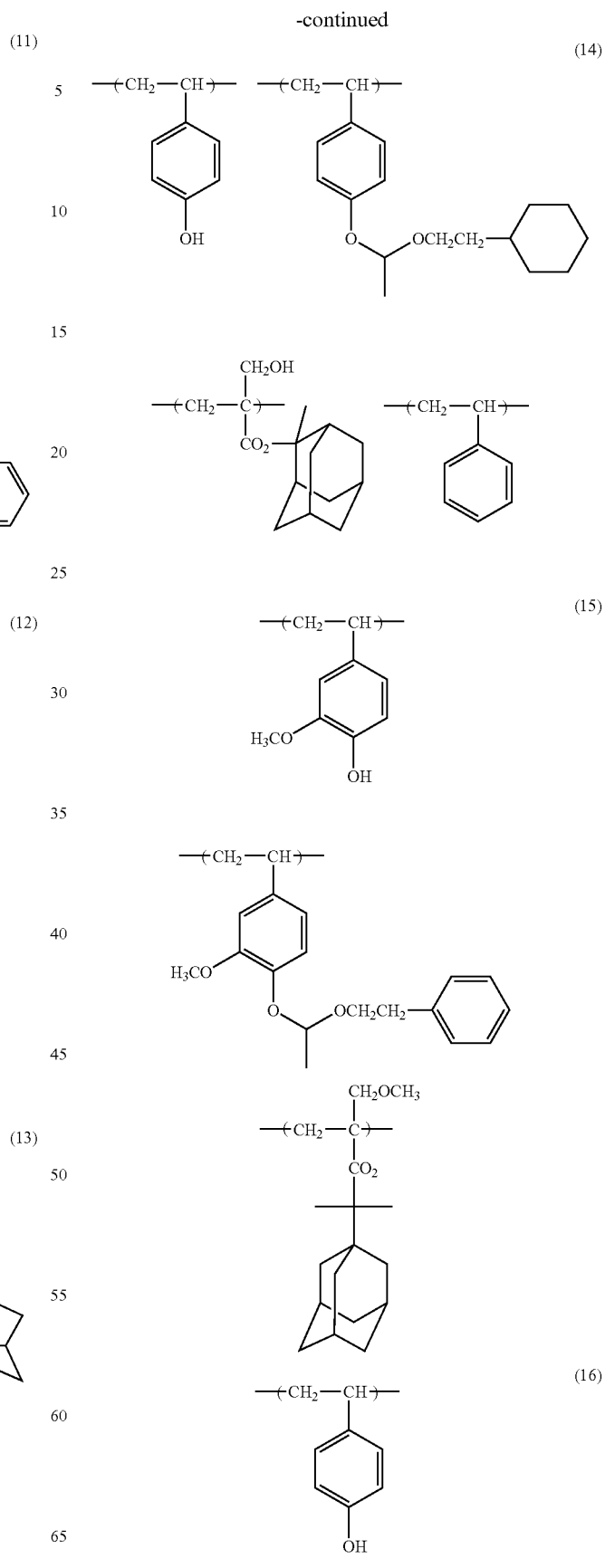

-continued

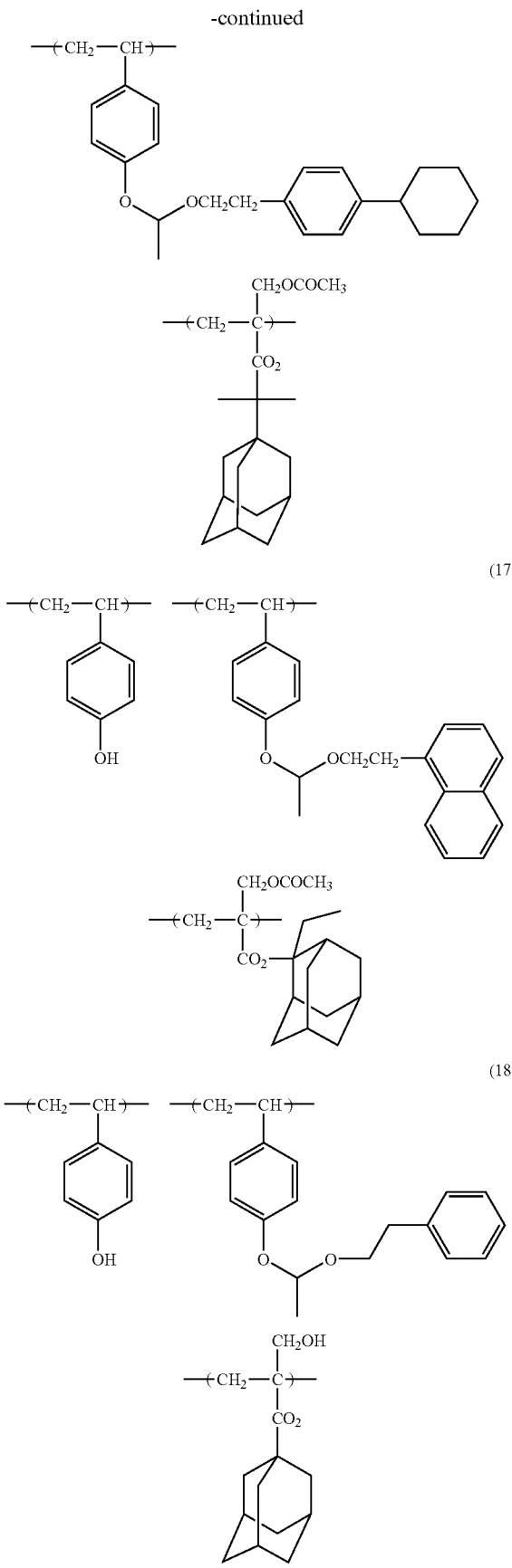

(17)

(18)

-continued

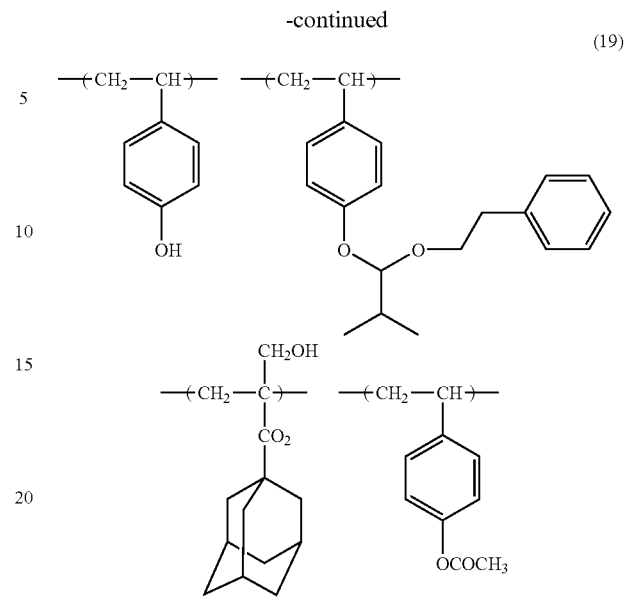

(19)

[2] (B) Compound Capable of Generating an Acid Upon Irradiation with Actinic Rays or Radiation The resist composition of the present invention contains a compound capable of generating an acid upon irradiation with actinic rays or radiation (photoacid generator).

The photoacid generator which can be used in the present invention is appropriately selected from compounds of generating an acid upon irradiation with known light (e.g., ultraviolet ray of 200 to 400 nm, far ultraviolet ray, particularly KrF excimer laser light), actinic rays (e.g., electron beam, X-ray, EUV) or radiation, which are used in a photoinitiator for photocationic polymerization, a photoirutiator for photoradical polymerization, a photo-decoloring agent for dyes, a photo-discoloring agent, a microresist and the like.

Other examples of the photoacid generator for use in the present invention include onium salts such as diazonium salt, ammonium salt, phosphonium salt, iodonium salt, sulfonium salt, selenonium salt and arsonium salts; organic halogen compounds; organic metals/organic halides; photoacid generators having an o-nitrobenzyl type protective group; compounds of photochemically decomposing to generate a sulfonic acid, as represented by iminosulfonate; disulfone compounds; and diazoketosulfone and diazodisulfone compounds.

In addition, compounds in which such a group or compound capable of generating an acid by light is introduced into the main or side chain can also be used.

Furthermore, compounds of generating an acid by light described, for example, in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may also be used.

Among these compounds of decomposing upon irradiation with actinic rays or radiation to generate an acid, the photoacid generators which are particularly effective are described below.

(1) Iodonium salt represented by the following formula (PAG3) and sulfonium salt represented by formula (PAG4)

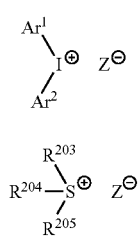
(PAG3)

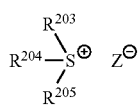
(PAG4)

In these formulae, $Ar^1$ and $Ar^2$ each independently represents an aryl group.

$R^{203}$, $R^{204}$ and $R^{205}$ each independently represents an alkyl group, a cycloalkyl group or an aryl group.

$Z^-$ represents a counter anion and examples thereof include, but are not limited to, $BF_4^-$, $AsF_6^-$, $PF_6^-$, $SbF_6^-$, $SiF_6^{2-}$, $ClO_4^-$, perfluoroalkane sulfonate anion (e.g. $CF_3SO_3^-$), pentafluorobenzene sulfonate anion, condensed polynuclear aromatic sulfonate anion (e.g., naphthalene-1-sulfonate anion), anthraquinone sulfonate anion and sulfonic acid group-containing dye.

Two of $R^{203}$, $R^{204}$ and $R^{205}$, or $Ar^1$ and $Ar^2$ may combine through a single bond or a substituent.

Specific examples thereof include the following compounds, but the present invention is not limited to these compounds.

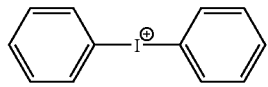 
(PAG3-1)

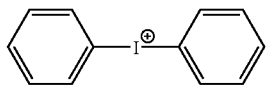 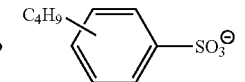
(PAG3-2)

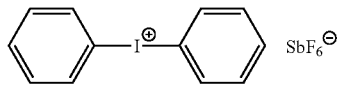
(PAG3-3)

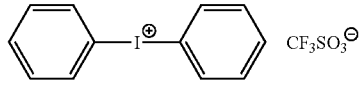
(PAG3-4)

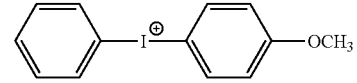
(PAG3-5)

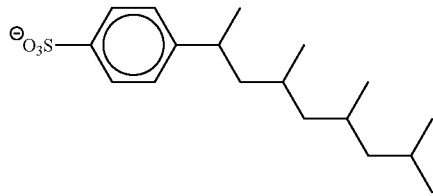

-continued

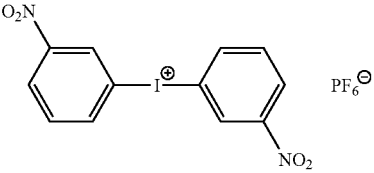
(PAG3-6)

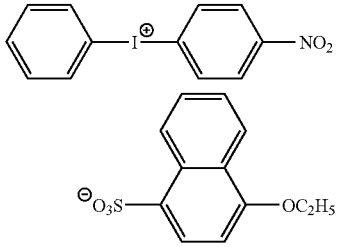
(PAG3-7)

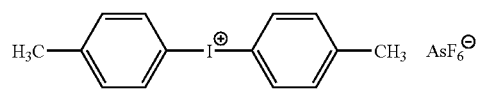
(PAG3-8)

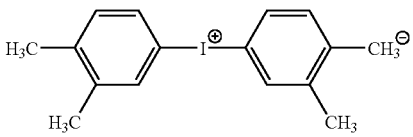
(PAG3-9)

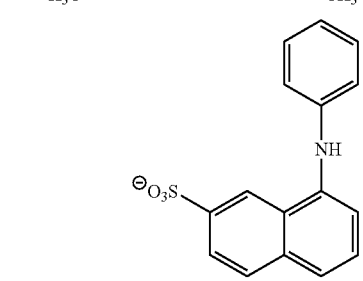

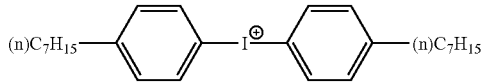
(PAG3-10)

(PAG3-11)

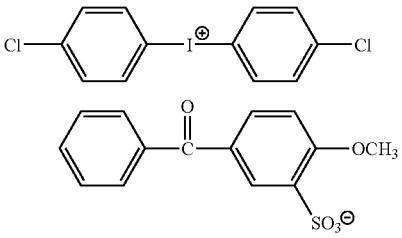

-continued
(PAG3-12)
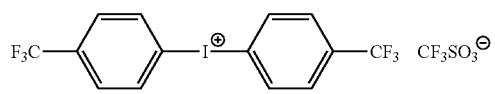
(PAG3-13)
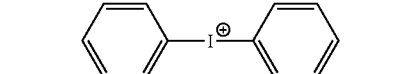
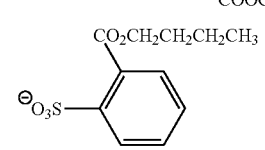
(PAG3-14)
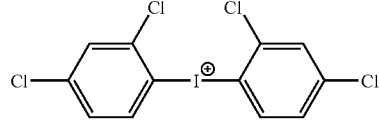
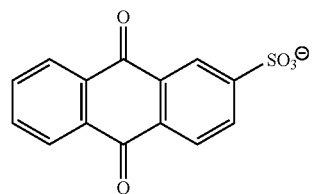
(PAG3-15)
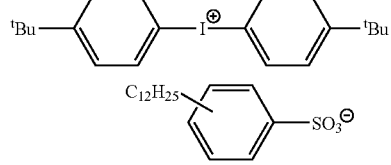
(PAG3-16)
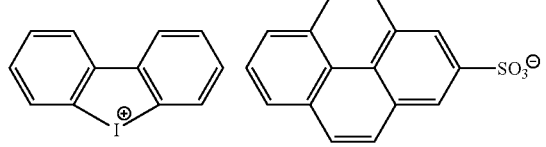
(PAG3-17)
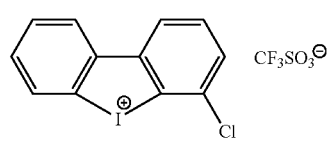
(PAG3-18)
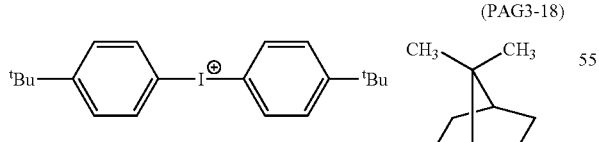
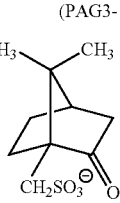
(PAG3-19)
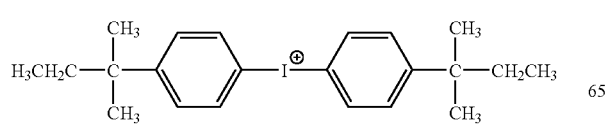
-continued
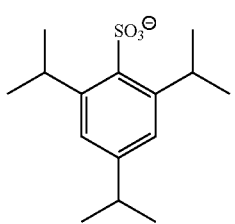
(PAG3-20)
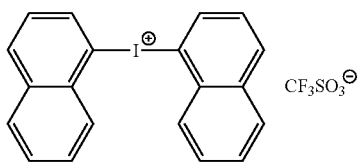
(PAG3-21)
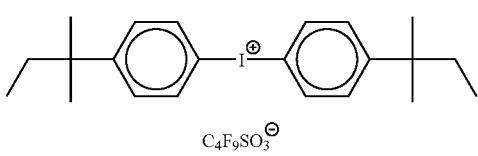
(PAG3-22)
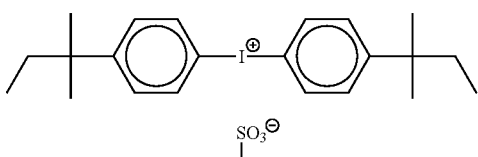
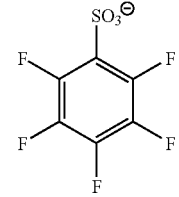
(PAG3-23)
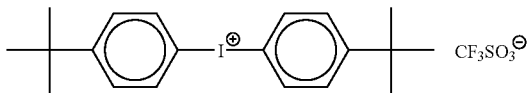
(PAG3-24)
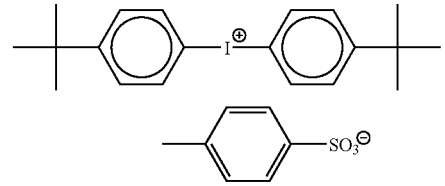
(PAG3-25)
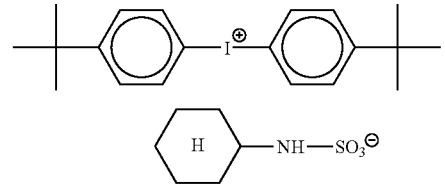
(PAG4-1)
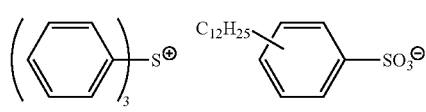

-continued
(PAG4-2)
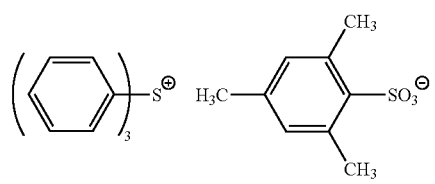
(PAG4-3)
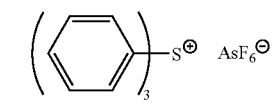
(PAG4-4)
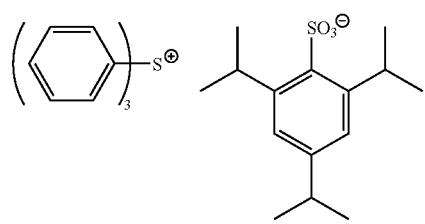
(PAG4-5)
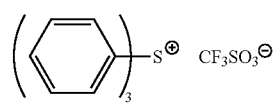
(PAG4-6)
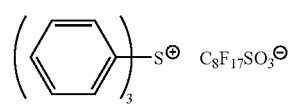
(PAG4-7)
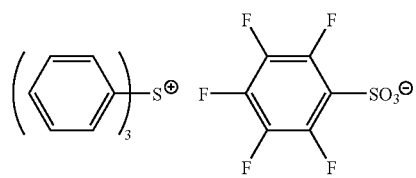
(PAG4-8)
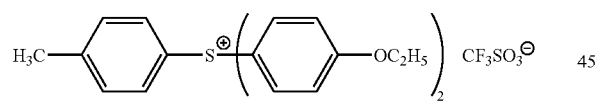
(PAG4-9)
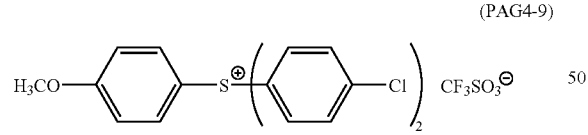
(PAG4-10)
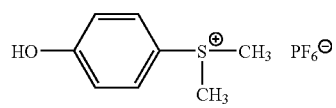
(PAG4-11)
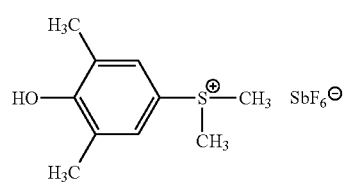
-continued
(PAG4-12)
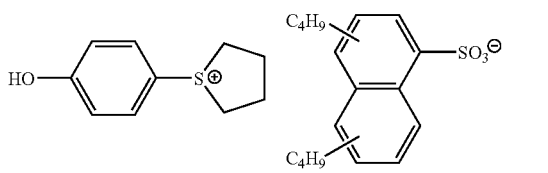
(PAG4-13)
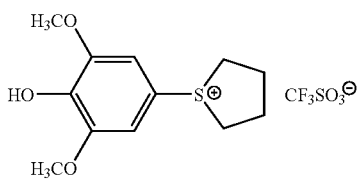
(PAG4-14)
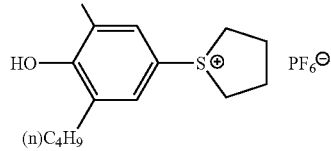
(PAG4-15)
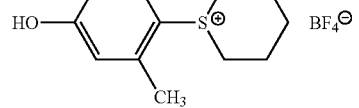
(PAG4-16)
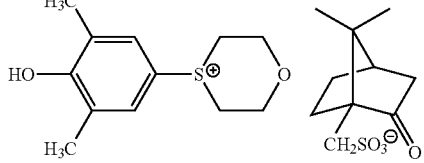
(PAG4-17)
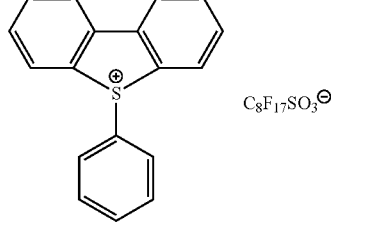
(PAG4-18)
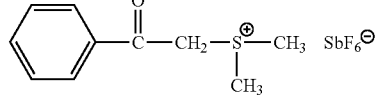
(PAG4-19)
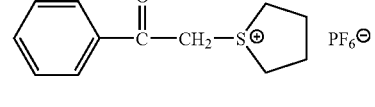
(PAG4-20)
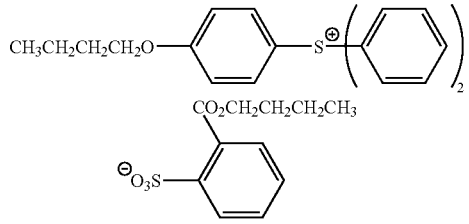

-continued
(PAG4-21)
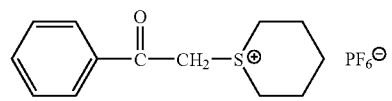
(PAG4-22)
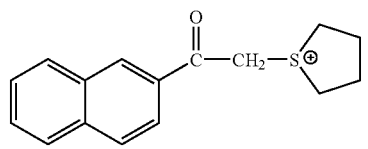
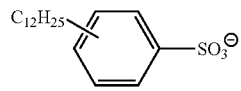
(PAG4-23)
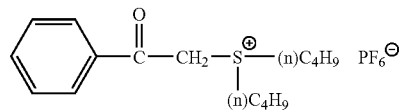
(PAG4-24)
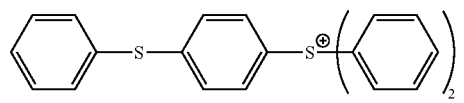
(PAG4-25)
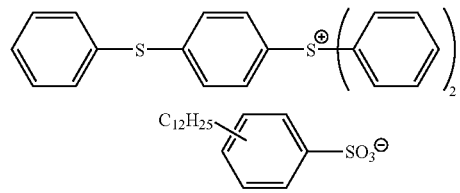
(PAG4-26)
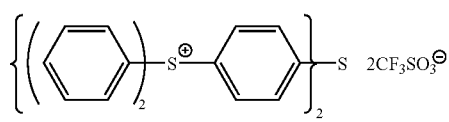
(PAG4-27)
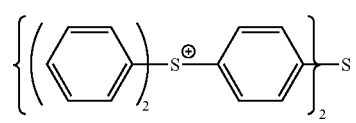
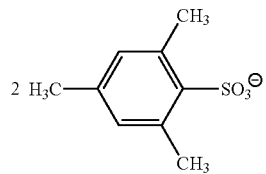
(PAG4-28)
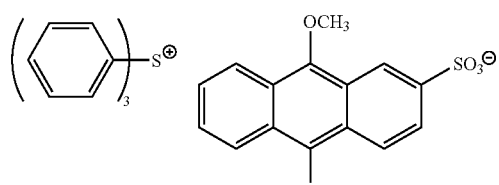
(PAG4-29)
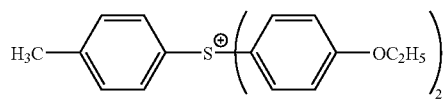
-continued
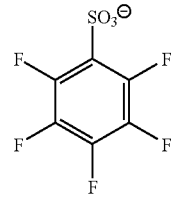
(PAG4-30)
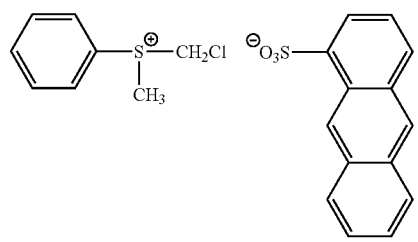
(PAG4-31)
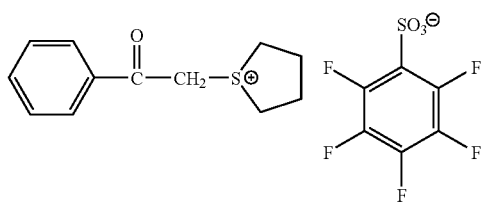
(PAG4-32)
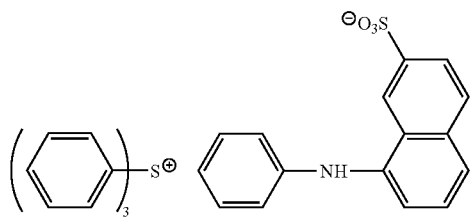
(PAG4-33)
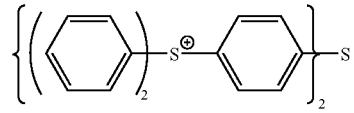
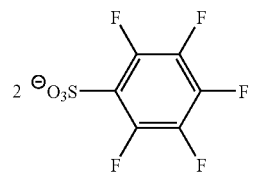
(PAG4-34)
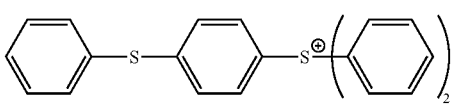
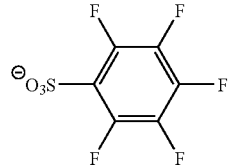

-continued (PAG4-35), (PAG4-36), PAG4-37, (PAG4-38), (PAG4-39), (PAG4-40), (PAG4-41), (PAG4-42), (PAG4-43), (PAG4-44)

-continued (PAG4-45), (PAG4-46), (PAG4-47), (PAG4-48), (PAG4-49), (PAG4-50), (PAG4-51), (PAG4-52), (PAG 4-53), (PAG 4-54), (PAG 4-55), (PAG 4-56)

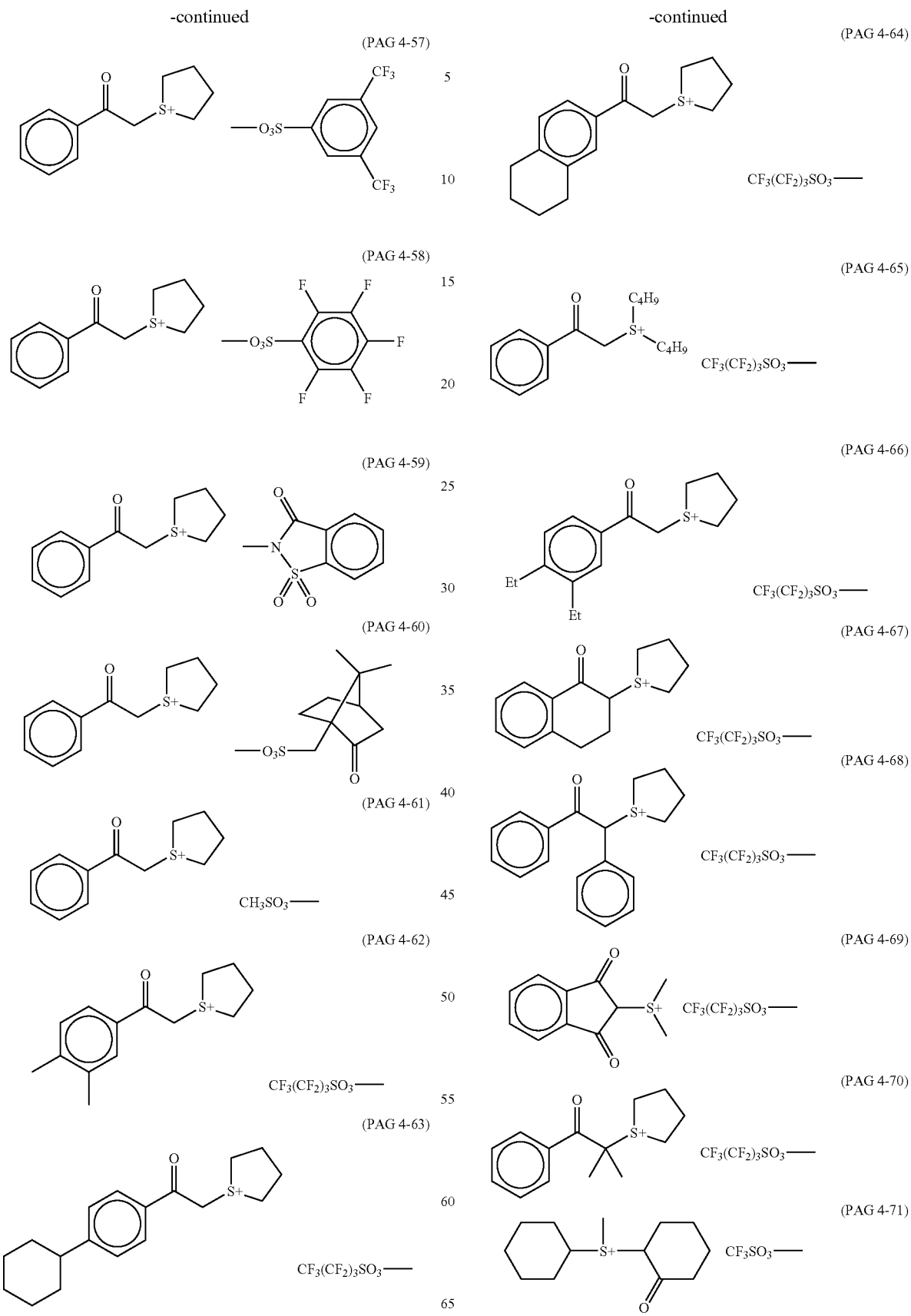

-continued (PAG 4-72) 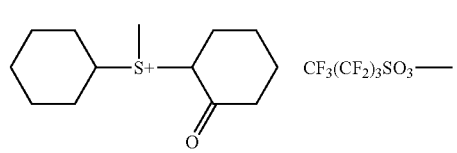 CF₃(CF₂)₃SO₃⁻

(PAG 4-73) 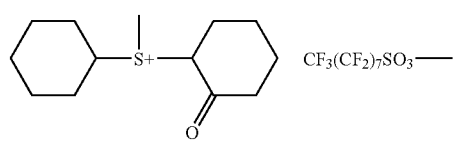 CF₃(CF₂)₇SO₃⁻

(PAG 4-74) 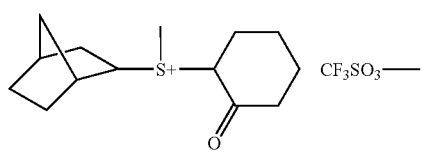 CF₃SO₃⁻

(PAG 4-75) 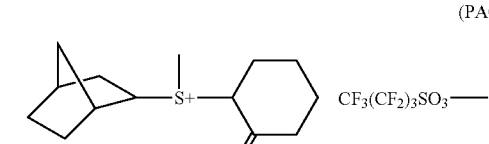 CF₃(CF₂)₃SO₃⁻

(PAG 4-76) 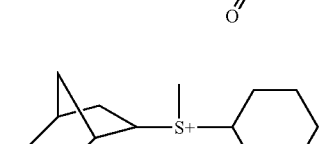 CF₃(CF₂)₇SO₃⁻

(PAG 4-77) 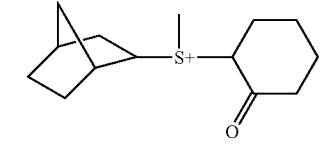 CF₃SO₃⁻

(PAG 4-78) 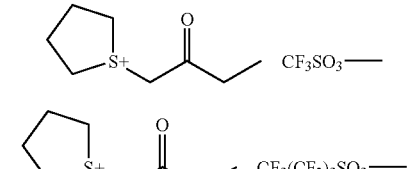 CF₃(CF₂)₃SO₃⁻

(PAG 4-79) 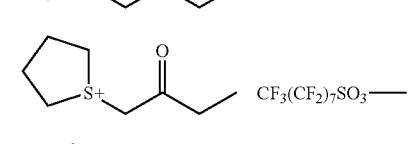 CF₃(CF₂)₇SO₃⁻

(PAG 4-80) 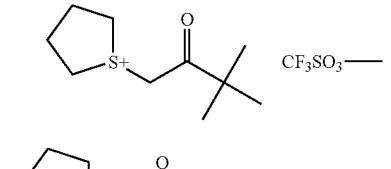 CF₃SO₃⁻

(PAG 4-81) 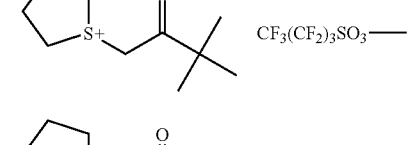 CF₃(CF₂)₃SO₃⁻

(PAG 4-82) 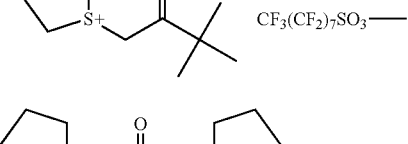 CF₃(CF₂)₇SO₃⁻

(PAG 4-83) 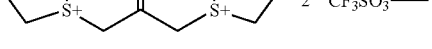 2 CF₃SO₃⁻

-continued (PAG 4-84) 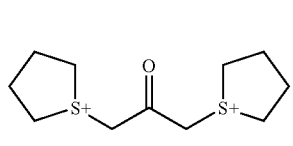 2 CF₃(CF₂)₃SO₃⁻

(PAG 4-85) 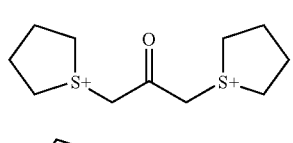 2 CF₃(CF₂)₇SO₃⁻

(PAG 4-86) 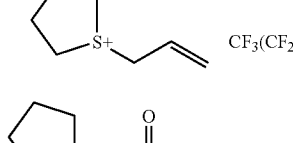 CF₃(CF₂)₃SO₃⁻

(PAG 4-87) 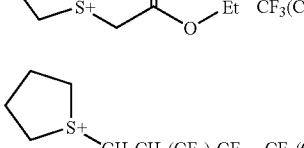 CF₃(CF₂)₃SO₃⁻

(PAG 4-88) 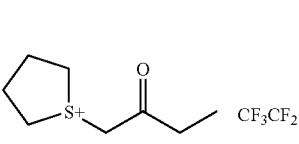 CF₃(CF₂)₃SO₃⁻

(PAG 4-89) 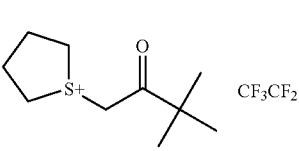 CF₃CF₂—O—CF₂CF₂SO₃⁻

(PAG 4-90) 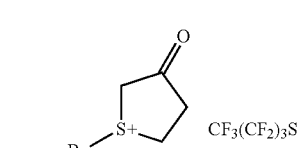 CF₃CF₂—O—CF₂CF₂SO₃⁻

(PAG 4-91) 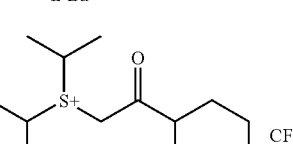 CF₃(CF₂)₃SO₃⁻

(PAG 4-92) 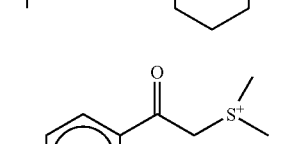 CF₃(CF₂)₃SO₃⁻

(PAG4-93) 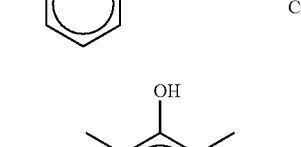 C₈F₁₇SO₃⁻

(PAG4-94) 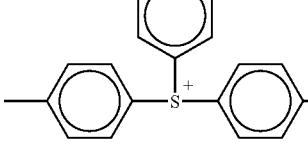 C₄F₉SO₃⁻

-continued (PAG4-95)

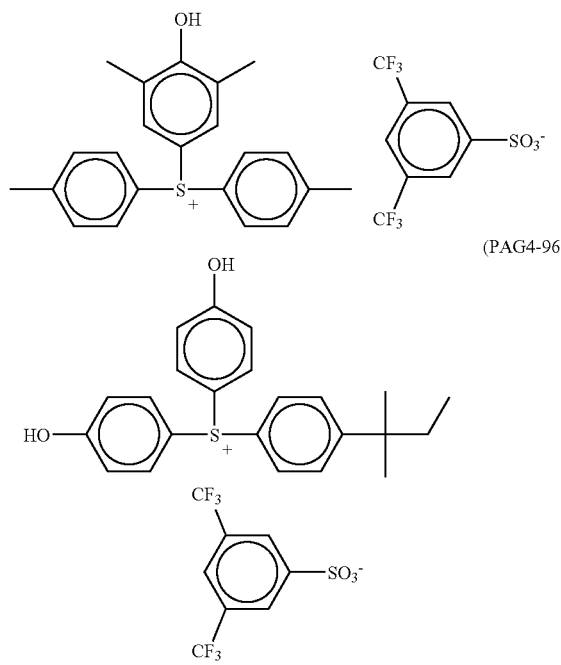

(PAG4-96)

In these formulae, Ph represents a phenyl group.

These onium salts represented by formulae (PAG3) and (PAG4) are known and may be synthesized by the method described, for example, in U.S. Pat. Nos. 2,807,648 and 4,247,473, and JP-A-53-101331 (3) Disulfonic acid derivative represented by the following formula (PAG5) and iminosulfonate derivative represented by formula (PAG6):

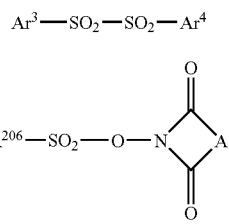

(PAG5)

(PAG6)

wherein $Ar^3$ and $Ar^4$ each independently represents an aryl group, $R^{206}$ represents an alkyl group, a cycloalkyl group or an aryl group, and A represents an alkylene group, an alkenylene group or an arylene group.

Specific examples thereof include, but are not limited to, the compounds set forth below.

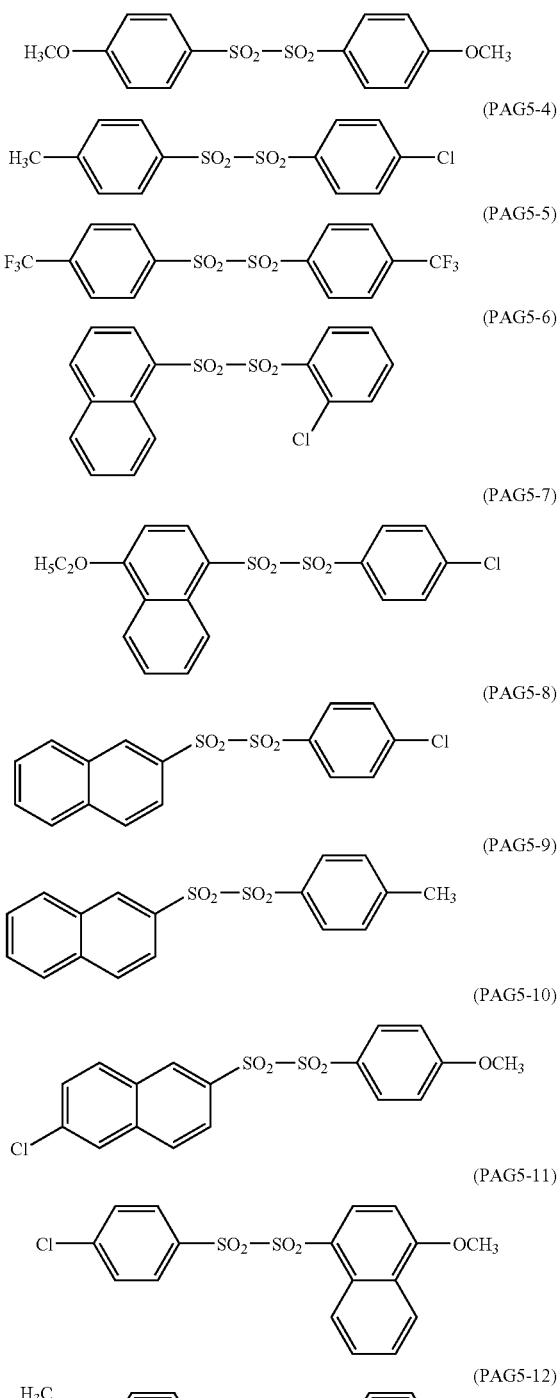

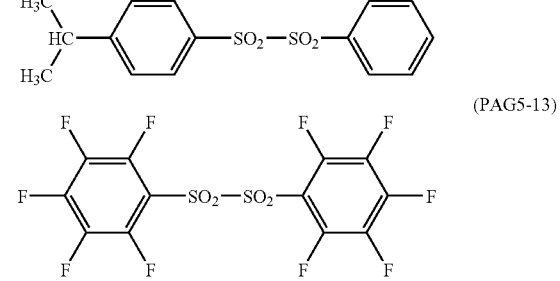

(PAG5-14)
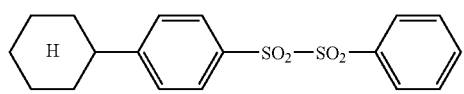
(PAG5-15)
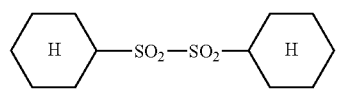
(PAG6-1)
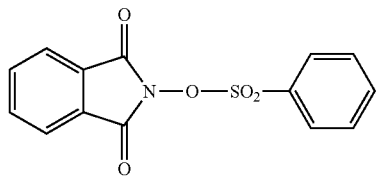
(PAG6-2)
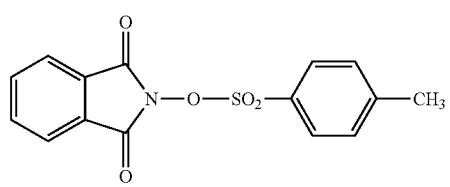
(PAG6-3)
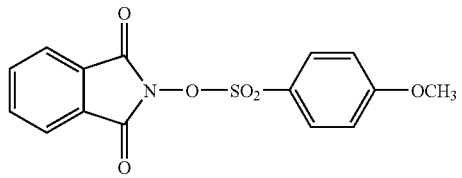
(PAG6-4)
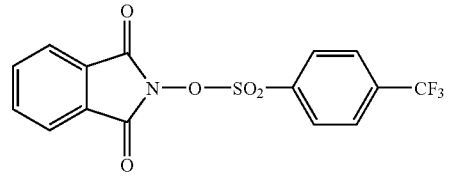
(PAG6-5)
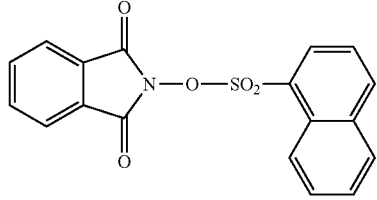
(PAG6-6)
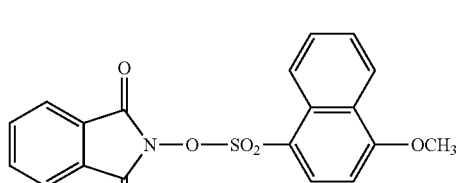
(PAG6-7)
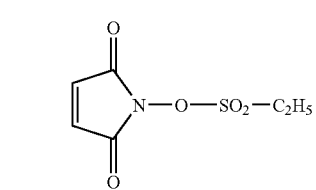
(PAG6-8)
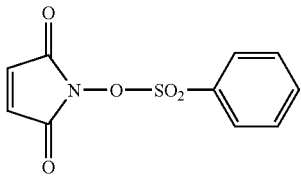
(PAG6-9)
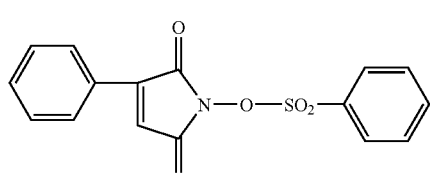
(PAG6-10)
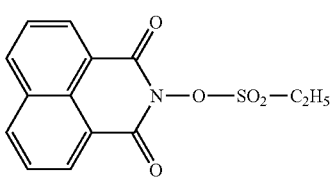
(PAG6-11)
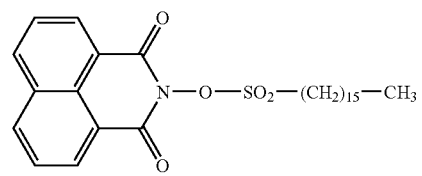
(PAG6-12)
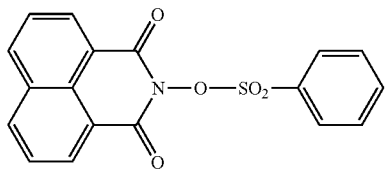
(PAG6-13)
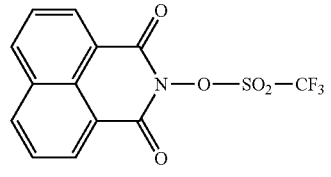
(PAG6-14)
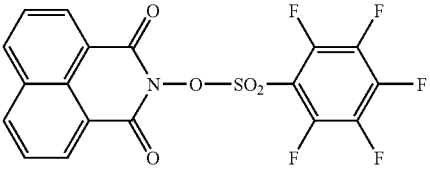
(PAG6-15)
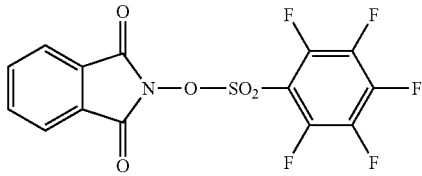

-continued
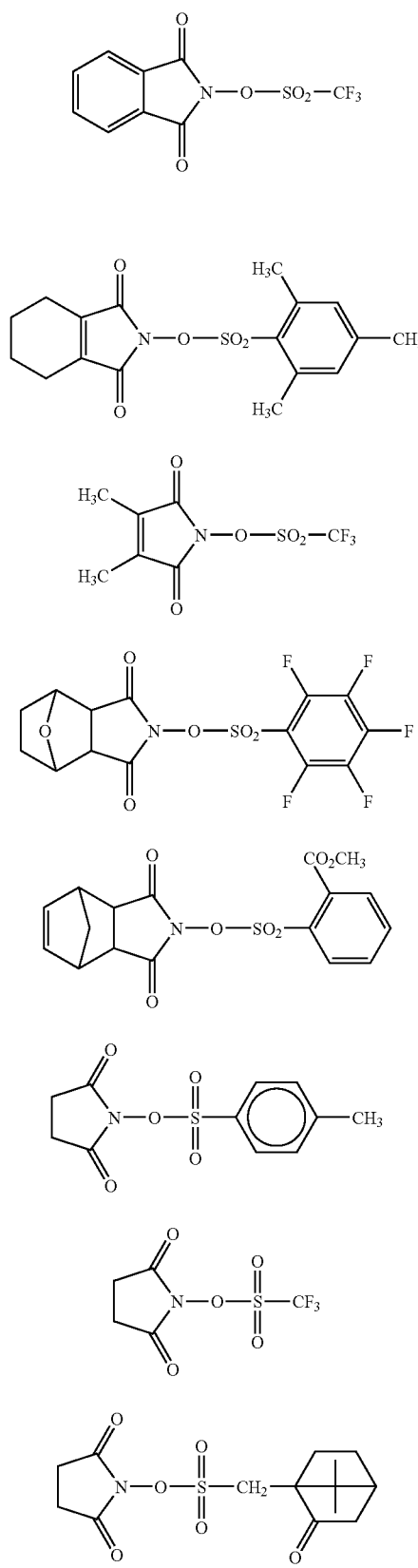
(PAG6-16)
(PAG6-17)
(PAG6-18)
(PAG6-19)
(PAG6-20)
(PAG6-21)
(PAG6-22)
(PAG6-23)
-continued
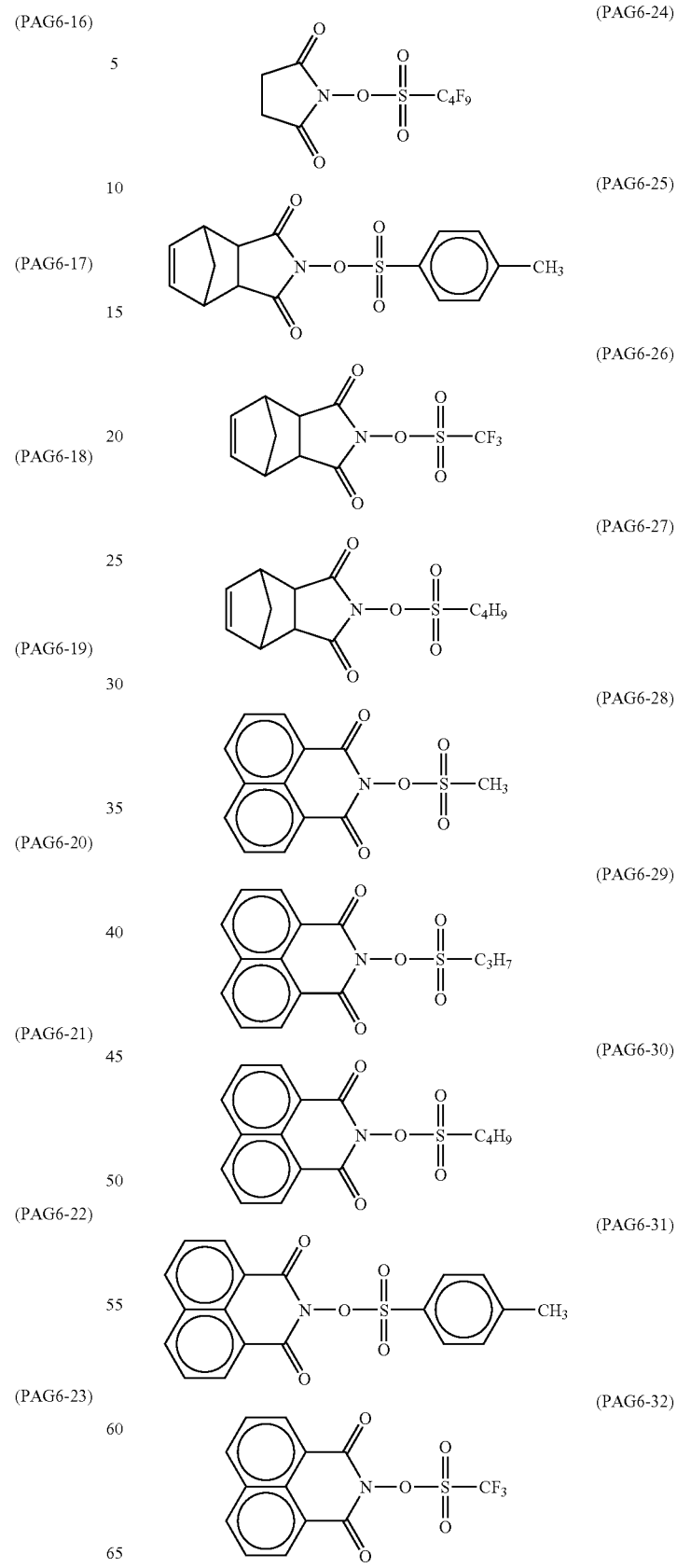
(PAG6-24)
(PAG6-25)
(PAG6-26)
(PAG6-27)
(PAG6-28)
(PAG6-29)
(PAG6-30)
(PAG6-31)
(PAG6-32)

-continued

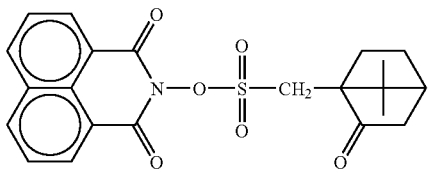
(PAG6-33)

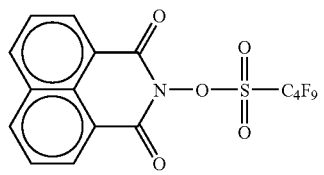
(PAG6-34)

(3) Diazodisulfone derivative represented by the following formula (PAG7)

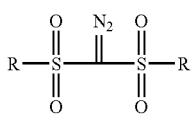
(PAG7)

wherein R represents an alkyl group or an aryl group.

Specific examples thereof include, but are not limited to, the compounds set forth below.

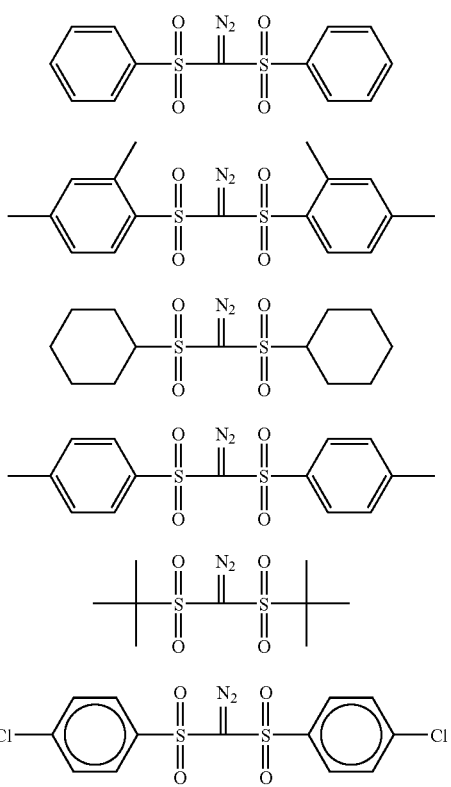

(PAG7-1)
(PAG7-2)
(PAG7-3)
(PAG7-4)
(PAG7-5)
(PAG7-6)

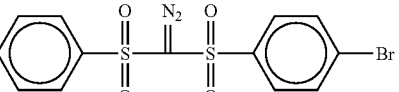
(PAG7-7)

(PAG7-8)

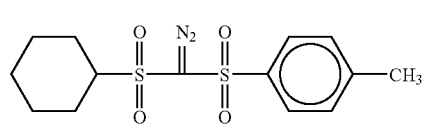
(PAG7-9)

The amount of the photoacid generator added is usually from 0.001 to 30 mass %, preferably from 0.3 to 20 mass %, more preferably from 0.5 to 10 mass %, based on the solid content of the composition.

That is, the amount of the photoacid generator is preferably 0.001 mass % or more in view of sensitivity and is preferably 30 mass % or less in view of light absorption and profile of resist, and process (particularly baking) margin.

[3] Surfactant (Component D)

The positive resist composition of the present invention preferably contains a surfactant, preferably any one of or two or more of fluorine-containing and/or silicon-containing surfactants (a fluorine-containing surfactant, a silicon-containing surfactant and a surfactant containing both a fluorine atom and a silicon atom).

When the positive resist composition of the present invention contains the above-described surfactant, this is effective on use of an exposure light source of 250 mn or less, particularly 220 nm or less, or at the formation of a pattern having a smaller line width, and a resist pattern with good sensitivity, high resolution and less failure of adhesion and development can be obtained.

Examples of these surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as-is.

Examples of the commercially available surfactant which can be used include fluorine-containing surfactants and silicon-containing surfactants, such as EFtop EF301 and EF303 (produced by Shin-Akita Kasei K. K.), Florad FC430 and 431 (produced by Suinitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as the silicon-containing surfactant.

Other than these known surfactants, surfactants using a polymer having a fluoro-aliphatic group, which is derived from a fluoroaliphatic compound produced by telomerization (also called telomer method) or oligomerization (also called oligomer method), may be used. The fluoroaliphatic compound can be synthesized by the method described in JP-A-2002-90991.

The polymer having a fluoroaliphatic group is preferably a copolymer of fluoroaliphatic group-containing monomer with (poly(oxyalkylene)) acrylate and/or (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) group and block-linked poly(oxyethylene and oxypropylene) group. Furthermore, the copolymer of fluoroaliphatic group-containing monomer with (poly(oxyalklene)) acrylate (or methacrylate) is not limited to a binary copolymer but may be a ternary or higher copolymer obtained by simultaneously copolymerizing two or more different fluoroaliphatic group-containing monomers or two or more different (poly(oxyalkylene)) acrylates (or methacrylates).

Examples thereof include commercially available surfactants such as Megafac F-178, F-470, F-473, F-475, F-476 and F-472 (produced by Dainippon Ink & Chemicals, Inc.), copolymers of acrylate (or methacrylate) having $C_6F_{13}$ group with (poly(oxyalkylene)) acrylate (or inethacrylate), copolymers of acrylate (or methacrylate) having $C_6F_{13}$ group with (poly(oxyethylene)) acrylate (or methacrylate) and (poly(oxypropylene)) acrylate (or methacrylate), copolymers of acrylate (or methacrylate) having $C_8F_{17}$ group with (poly(oxyalkylene)) acrylate (or methacrylate), and copolymers of acrylate (or methacrylate) having $C_8F_{17}$ group with (poly(oxyethylene)) acrylate (or metliacrylate) and (poly(oxypropylene)) acrylate (or metliacrylate).

Examples of the surfactant other than these fluorine-containing and/or silicon-containing surfactants, which can be used, include nonionic surfactants such as polyoxyethylene alkyl ethers (e.g., polyoxyetlhylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan inonostearate, sorbitan monooleate, sorbitan trioleate, sorbitan tristearate) and polyoxyethylene sorbitan fatty acid esters (e.g., polyoxyethylene sorbitan monolaurate, polyoxyetlylene sorbitan monopalmitate, polyoxyethylene sorbitan monostearate, polyoxyethylene sorbitan trioleate, polyoxyethylene sorbitan tristearate).

The amount of the surfactant (D) used is preferably from 0.0001 to 2 mass %, more preferably from 0.001 to 1 mass %, still more preferably from 0.01 to 1 mass %, based on the entire amount (excluding the solvent) of the positive resist composition.

[4] Organic Basic Compound (Component E)

The resist composition of the present invention preferably contains an organic basic compound. The organic basic compound is preferably a compound having a basicity stronger than phenol. In particular, a nitrogen-containing basic compound is preferred and examples thereof include the structures represented the following formulae (A) to (E).

(A)

wherein $R^{250}$, $R^{251}$ and $R_{252}$ each independently represents a hydrogen atom, an alkyl group having from 1 to 20 carbon atoms, a cycloalkyl group having from 3 to 20 carbon atoms or an aryl group having from 6 to 20 carbon atoms, and $R^{250}$ and $R^{251}$ may combine with each other to form a ring. These groups each may have a substituent and the alkyl or cycloalkyl group having a substituent is preferably an aminoalkyl group having from 1 to 20 carbon atoms, an aminocycloalkyl group having from 3 to 20 carbon atoms, a hydroxyalkyl group having from 1 to 20 carbon atoms, or an aminocycloalkyl group having from 3 to 20 carbon atoms.

In the alkyl chain of these groups, an oxygen atom, a sulfur atom or a nitrogen atom may be contained.

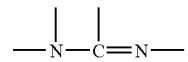
(B)

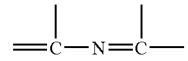
(C)

(D)

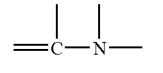

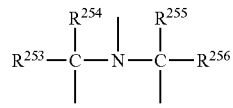
(E)

(wherein $R^{253}$, $R^{254}$, $R^{255}$ and $R^{256}$ each independently represents an alkyl group having from 1 to 6 carbon atoms or a cycloalkyl group having from 3 to 6 carbon atoms).

The compound is more preferably a nitrogen-containing basic compound having two or more nitrogen atoms differing in the chemical environment with one molecule, still more preferably a compound containing both a substituted or unsubstituted amino group and a ring structure containing a nitrogen atom, or a compound containing an allylamino group.

Specific preferred examples thereof include guanidine, aminopyridine, aminoalkylpyridine, aminopyrrolidine, indazole, pyrazole, pyrazine, pyrimidine, purine, inidazoline, pyrazoline, piperazine, piperidine, aminomorpholine and aminoalkylmorpholine. These compounds each may have a substituent and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Specific preferred examples of the nitrogen-containing basic compound include, but are not limited to, guanidine, 1,1-dimethylguanidine, 1,1,3,3-tetramethylguanidine, 2-aminopyridine, 3-aminopyridine, 4-amino-pyridine, 2-dimethylaminopyridine, 4-dimethylaminopyridine, 2-diethylaninopyridine, 2-(aminomethyl)pyridine, 2-amino-3-methylpyridine, 2-amino-4-methylpyridine, 2-amino-5-methylpyridine, 2-amino-6-methylpyridine aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6- dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, tertiary morpholine derivatives (e.g., cyclohexylmorpholinoethyl thiourea (CHMETU)), and hindered amines described in JP-A-11-52575 (e.g., those described in paragraph [0005]).

Among these, more preferred are 1,5-diazabicyclo[4.3.0]non-5-ene, 1,8-diazabicyclo[5.4.0]undec-7-ene, 1,4-diazabicyclo[2.2.2]octane, 4-dimethylaminopyridine, hexamethylenetetramine, 4,4-dimethylimnidazoline, pyrroles, pyrazoles, imidazoles, pyridazines, pyrimidines, tertiary morpholine derivatives (e.g., CHMETU), and hindered amines (e.g., bis(1,2,2,6,6-pentamethyl-4-piperidyl) sebacate). In particular, 1,5-diazabicyclo[4.3.0]non-5-ene, 1,8-diazabicyclo[5.4.0]undec-7-ene, 1,4-diazabicyclo[2.2.2]octane, 4-dimethylaininopyridine, hexamethylenetrainine, CHMETU and bis(1,2,2,6,6-pentaunethyl-4-piperidyl)sebacate are preferred.

The nitrogen-containing basic compounds can be used individually or in combination of two or more thereof. The amount of the nitrogen-containing basic compound used is usually from 0.001 to 10 mass %, preferably from 0.01 to 5 mass %, based on the entire solid content of the resist composition of the present invention. That is, the amount is preferably 0.001 mass % or more for obtaining a sufficiently high effect by the addition, and preferably 10 mass % or less in view of sensitivity and developability of the unexposed area.

[5] Other Additives

The positive resist composition of the present invention may further contain, if desired, an acid-decomposable dissolution-inhibiting compound, a dye, a plasticizer, a photosensitizer, a compound capable of accelerating solubility in the developer, and the like.

[6] Solvent (Component C)

The resist composition of the present invention is dissolved in a solvent capable of dissolving respective components described above and then coated on a support. Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME), propylene glycol monomethyl ether acetate (PGMEA), propylene carbonate, toluene, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used individually or in combination of two or more thereof.

Among these solvents, preferred are propylene glycol monomethyl ether acetate, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, propylene carbonate, butyl acetate, methyl lactate, ethyl lactate, methyl methoxypropionate, ethyl ethoxypropionate, N-methylpyrrolidone and tetrahydrofuran.

By using the solvent, a resist composition is prepared to a concentration of, in terms of the entire solid concentration of resist components, usually from 3 to 25 mass %, preferably from 5 to 22 mass %, more preferably from 7 to 20 mass %.

In view of in-plane coating uniformity, storage stability, defocus latitude depended on line pitch, development defect and the like, a mixed solvent is preferably used.

The mixed solvent is preferably a mixed solvent of a solvent of the following Group A and at least one solvent selected from Groups B and C, or a mixed solvent of a solvent of Group D and at least one solvent selected from Groups E and F.

Group A: propylene glycol monomethyl ether acetate
Group B: propylene glycol monomethyl ether, and ethyl lactate
Group C: γ-butyrolactone, and propylene carbonate
Group D: 2-heptanone
Group E: propylene glycol monomethyl ether, ethyl lactate, and butyl acetate
Group F: γ-butyrolactone, and propylene carbonate The solvent of Group A and the solvent of Group B are preferably used at a mass ratio (A:B) of 90:10 to 15:85, more preferably from 85:15 to 20:80, still more preferably from 80:20 to 25:75.

The solvent of Group A and the solvent of Group C are preferably used at a mass ratio (A:C) of 99.9:0.1 to 75:25, more preferably from 99:1 to 80:20, still more preferably from 97:3 to 85:15.

In the case of combining three solvents of Groups A, B and C, the solvent of Group C is preferably used at a mass ratio of 0.1 to 25 mass %, more preferably from 1 to 20 mass %, still more preferably from 3 to 17 mass %, based on all solvents.

In this preferred mixed solvent, other solvent may be added. The amount of such other solvent added is generally 30 parts by mass or less per 100 parts by mass of the mixed solvent.

The solvent of Group D is usually used in an amount of 30 mass % or more, preferably 40 mass % or more, more preferably 50 mass % or more, based on all solvents.

The solvent of Group E is usually used in an amount of 5 to 70 mass %, preferably from 10 to 60 mass %, more preferably from 15 to 50 mass %, based on all solvents.

The solvent of Group F is usually used in an amount of 0.1 to 25 mass %, preferably from 1 to 20 mass %, more preferably from 3 to 15 mass %, based on all solvents.

The other solvent is usually used in an amount of 20 mass % or less, preferably 10 mass % or less.

Specific examples of the combination include the followings:

propylene glycol monomethyl ether acetate/propylene glycol monomethyl ether,
propylene glycol monomethyl ether acetate/ethyl lactate,
propylene glycol monomethyl ether acetate/γ-butyrolactone,
propylene glycol monomethyl ether acetate/propylene carbonate,
propylene glycol monomethyl ether acetate/propylene glycol monomethyl ether/γ-butyrolactone,
propylene glycol monomethyl ether acetate/propylene glycol monomethyl ether/propylene carbonate,
propylene glycol monomethyl ether acetate/ethyl lactate/γ-butyrolactone,
propylene glycol monomethyl ether acetate/ethyl lactate/propylene carbonate,
2-heptanone/propylene glycol monomethyl ether,
2-heptanone/ethyl lactate,
2-heptanone/γ-butyrolactone, 2-heptanone/propylene carbonate,
2-heptanone/propylene glycol monomethyl ether/γ-butyrolactone,
2-heptanone/propylene glycol monomethyl ether/propylene carbonate,
2-heptanone/ethyl lactate/γ-butyrolactone, and
2-heptanone/ethyl lactate/propylene carbonate.

Also, ethyl lactate/butyl acetate (usually at a mass ratio of 10/90 to 90/10, preferably from 30/70 to 70/30) can be used.

The positive resist composition of the present invention is coated on a substrate to form a thin film. The thickness of this coating film is preferably from 0.2 to 1.2 μm.

Examples of the substrate which can be used include a normal bare Si substrate, an SOG substrate and a substrate having an inorganic antireflection film described below.

Also, a commercially available inorganic or organic antireflection film can be used, if desired.

The antireflection film which can be used includes an inorganic film type such as titanium, titanium dioxide, titanium nitride, cliroiuni oxide, carbon and α-silicon, and an organic film type comprising a light absorbent and a polymer material. For forming the former film, equipment such as vacuum vapor deposition apparatus, CVD apparatus or sputtering apparatus is necessary. Examples of the organic antireflection film include a film comprising a condensate of a diphenylamine derivative and a formaldehyde-modified melamine resin, an alkali-soluble resin and a light absorbent described in JP-B-7-69611 (the term "JP-B" as used herein means an "examined Japanese patent publication"), a reactant of a maleic anhydride copolymer with a diamine-type light absorbent described in U.S. Pat. No. 5,294,680, a film containing a resin binder and a methylolmelainine-based thermal crosslinking agent described in JP-A-6-118631, an acrylic resin-type antireflection film having a carboxylic acid group, an epoxy group and a light-absorbing group within the same molecule described in JP-A-6-118656, a film comprising methylolmelamine and benzophenone-base light absorbent described in JP-A-8-87115, and a film obtained by adding a low molecular light absorbent to a polyvinyl alcohol resin described in JP-A-8-179509.

In addition, for example, DUV30 series, DUV-40 series and ARC25 produced by BREWER Science, and AC-2, AC-3, AR-19 and AR-20 produced by Shipley may be also used as the organic antireflection film.

The resist solution is coated on a substrate (e.g., silicon/silicon dioxide coated substrate) (if desired, on a substrate having provided thereon the above-described antireflection film) for use in the production of a precision integrated circuit device by an appropriate coating method such as spinner or coater, dried to form a resist film, exposed through a predetermined mask and preferably after baking, developed, whereby a good resist pattern can be obtained. The exposure light is preferably KrF excimer laser light (248 nm), EUV (extreme ultraviolet), X-ray or electron beam.

The alkali developer which can be used is an alkaline aqueous solution (usually from 0.1 to 10 mass %) of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylanmine, an alcohol amine such as dunethylethanolamine and triethanolamine, a quaternary ammonium salt such as tetramethylammonium hydroxide and tetraethylamunonium hydroxide, and a cyclic amine such as pyrrole and piperidine. This alkaline aqueous solution may also be used after adding thereto an appropriate amount of an alcohol or surfactant.

EXAMPLES

The present invention is described in greater detail below by referring to Examples, but the present invention is not limited thereto.

Synthesis of Resin (4):

4-Acetoxystyrene and 2-methyl-2-adamantyl (α-hydroxymethyl)acrylate were charged at a ratio of 60/40 (by mol) and dissolved in propylene glycol monomethyl ether to prepare 450 g of a solution having a solid concentration of 22 mass %. To this solution, 8 mol % of polymerization initiator V-601 produced by Wako Pure Chemical Industries, Ltd. was added and the resulting solution was added dropwise to 40 g of propylene glycol monomethyl ether heated at 80° C., over 4 hours in a nitrogen atmosphere. After the completion of dropwise addition, the reaction solution was stirred for 2 hours and after the completion of reaction, the reaction solution was cooled to room temperature and then crystallized in 5 L of methanol. The precipitated white powder was collected by filtration and thereto, 500 ml of methanol was again added. Thereafter, 10 g of dimethylaminopyridine was added and the resulting solution was stirred under heating at 65° C. for 5 hours. The reaction solution was neutralized with 1/10 N hydrochloric acid and then crystallized in 5 L of distilled water, and the precipitated white powder was collected by filtration and reslurried to recover 50 g of the objective Resin (4) which is previously exemplified.

The polymer composition ratio (by mol) determined from NMR was 57/43. The standard polystyrene-reduced weight average molecular weight was measured by gel permeation chromatography (GPC) and determined as 9,600.

Resins (1) to (3), (5) to (7), (9), (10), (12), (14) to (16) and (19) each having a composition ratio and a molecular weight shown below, which are previously exemplified, were synthesized in the same manner as in the synthesis above. In the Table below, the composition ratio of repeating units is in the order of structural formulae from the left.

TABLE 1

| Resin | Repeating Units (molar ratio)* | Weight Average Molecular Weight |
|---|---|---|
| 1 | 65/35 | 9600 |
| 2 | 60/25/15 | 12500 |
| 3 | 60/15/25 | 10500 |
| 4 | 57/43 | 9600 |
| 5 | 15/55/30 | 13000 |
| 6 | 15/55/30 | 12000 |
| 7 | 60/30/10 | 8000 |
| 9 | 70/30 | 10000 |
| 10 | 55/30/15 | 10500 |
| 12 | 20/30/50 | 11000 |
| 14 | 65/15/10/10 | 8900 |
| 15 | 60/30/10 | 11000 |
| 16 | 65/25/10 | 12000 |
| 19 | 60/25/10/5 | 10000 |

*In the order of repeating units from the left in the resin exemplified.

(Preparation and Evaluation of Positive Resist Composition)

Example 1

A solution containing respective components shown in Example 1 of Table 2 was prepared and then microfiltered through a membrane filter having an opening size of 0.1 µm, and the resulting solution was coated on a 6-inch silicon wafer by using a spin coater Mark 8 manufactured by Tokyo Electron Ltd. and then baked at 110° C. for 90 seconds to obtain a 0.30 µm-thick resist film.

(2) Production and Evaluation of Positive Resist Pattern

This resist film was irradiated with electron beams by using an electron beam image-drawing device (HL750, manufactured by Hitachi Ltd., accelerating voltage: 50 KeV). After the irradiation, the resist film was baked at 110° C. for 90 seconds, dipped in an aqueous 2.38 mass % tetramethylammonium hydroxide (TMAH) solution for 60 seconds, rinsed with water for 30 seconds and then dried. The obtained pattern was evaluated by wing methods.

(2-1) Sensitivity

The cross-sectional profile of the pattern obtained was observed by using a scanning electron microscope (S-4300, manufactured by Hitachi, Ltd.). The minimum irradiation energy when resolving a 0.15-µm line (line: space=1:1) was defined as the sensitivity.

(2-2) Resolution

The limiting resolution (line and space were separated and resolved) at the irradiation dosage of giving the above-described sensitivity was defined as the resolution.

The thus-obtained wafer was exposed by using an electron beam direct image-drawing device (50 KeV) while changing the exposure amount, then heated at 130° C. for 90 seconds in a clean room, developed with a tetramethylammonium hydroxide developer (2.38 mass %) for 60 seconds, rised with distilled water, and dried to obtain a pattern.

With respect to the region of 5 µm from the edge in the longitudinal direction of the 120-nm line pattern obtained by the electron beam image-drawing, the distance from a reference line where the edge should be present was measured at 50 points by length measuring SEM (S-9220, manufactured by Hitachi, Ltd.), and a standard deviation was determined to calculate 3σ. A smaller value reveals a higher performance.

Examples 2 to 14 and Comparative Examples 1 and 2

By using respective components shown in Table 2, each pattern was formed and evaluated in the same manner as in Example 1 through preparation, coating and electron beam irradiation of the resist.

In Comparative Example 1, a hydroxystyrene/2-methyl-2-adamantyl acrylate copolymer (copolymerization ratio: 57/43 (by mol), weight average molecular weight: 9,600) was used as Resin R1.

TABLE 2

| | Component | | | | | Evaluation | | | |
|---|---|---|---|---|---|---|---|---|---|
| | Resin (10 g) | Photoacid Generator | Basic Compound | Surfactant (10 mg) | Solvent (148.0 g) | Sensitivity ($\mu C/cm^2$) | Resolving Power ($\mu m$) | Pattern Profile | Line Edge Roughness |
| Example 1 | 4 | PAG4-6/4-53 = 180 mg/200 mg | E1 = 20 mg | 1 | S1/S2 = 7/3 | 5.5 | 0.10 | rectangular | 7 |
| Example 2 | 2 | PAG4-39/4-62 = 160 mg/180 mg | E2 = 22 mg | 2 | S1/S3 = 95/5 | 4.5 | 0.11 | rectangular | 7 |
| Example 3 | 3 | PAG4-45/4-63 = 150 mg/200 mg | E3 = 19 mg | 3 | S1/S2 = 8/2 | 5.0 | 0.09 | rectangular | 8 |
| Example 4 | 1 | PAG4-39/4-65 = 130 mg/250 mg | E6 = 17 mg | 4 | S6/S2 = 7/3 | 5.5 | 0.10 | rectangular | 7 |
| Example 5 | 5 | PAG4-48/4-63 = 150 mg/200 mg | E4/E5 = 10 mg/10 mg | 5 | S4/S5 = 6/4 | 4.5 | 0.09 | rectangular | 7 |
| Example 6 | 6 | PAG4-50/4-70 = 150 mg/200 mg | E6 = 16 mg | 5 | S1/S2 = 6/4 | 5.0 | 0.10 | rectangular | 8 |
| Example 7 | 7 | PAG4-52/4-65 = 150 mg/200 mg | E1 = 19 mg | 5 | S1/S2 = 7/3 | 5.0 | 0.09 | rectangular | 7 |
| Example 8 | 9 | PAG4-48/4-65/4-79 = 130 mg/200 mg/50 mg | E1/E6 = 14 mg/6 mg | 2 | S1/S2 = 7/3 | 4.5 | 0.10 | rectangular | 7 |
| Example 9 | 10 | PAG4-52/4-70 = 150 mg/200 mg | E2/E6 = 12 mg/8 mg | 3 | S1/S2 = 7/3 | 5.0 | 0.09 | rectangular | 8 |
| Example 10 | 12 | PAG4-48/4-65 = 160 mg/180 mg | E1 = 20 mg | 1 | S1/S2/S3 = 70/26/4 | 4.5 | 0.10 | rectangular | 8 |
| Example 11 | 14 | PAG4-6/4-53 = 350 mg/150 mg | E1 = 30 mg | 1 | S1/S2 = 7/3 | 5.8 | 0.10 | rectangular | 7 |
| Example 12 | 15 | PAG4-50/4-70 = 400 mg/150 mg | E2 = 30 mg | 2 | S1/S2 = 7/3 | 5.5 | 0.12 | rectangular | 7 |
| Example 13 | 16 | PAG4-36/4-65 = 300 mg/250 mg | E2 = 30 mg | 2 | S1/S2 = 7/3 | 5.5 | 0.12 | rectangular | 8 |
| Example 14 | 19 | PAG4-6/4-53 = 450 mg/150 mg | E1 = 30 mg | 1 | S1/S2 = 7/3 | 5.2 | 0.11 | rectangular | 7 |
| Comparative Example 1 | R1 | PAG4-3 = 200 mg | None | none | S7 | 6.8 | 0.13 | tapered | 12 |
| Comparative Example 2 | R1 | PAG4-6/4-53 = 180 mg/200 mg | E1 = 20 mg | 1 | S1/S2 = 7/3 | 6.5 | 0.13 | tapered | 10 |

(2-3) Pattern Profile

The cross-sectional profile of a 0.15 µm-line pattern at the irradiation dosage of giving the above-described sensitivity was observed by using a scanning electron microscope (S-4300, manufactured by Hitachi, Ltd.) and evaluated on a three-stage scale of "rectangular", "slightly tapered" and "tapered".

(2-4) Line Edge Roughness

The resist composition prepared above was coated on a silicon wafer and then baked at 110° C. for 60 seconds to provide a film having a thickness of 150 nm.

The symbols for components in Table 2 indicate the followings.

Incidentally, the resins and photoacid generators are previously exemplified.

[Surfactant]
1: Megafac F176 (produced by Dainippon Ink & Chemicals, Inc.) (fluorine-containing surfactant)
2: Megafac R08 ((produced by Dainippon Ink & Chemicals, Inc.) (fluorine/silicon-containing surfactant)
3: polysiloxane polymer KP-341 (produced by Shin-Etsu Chemical Co., Ltd.)

4: polyoxyethylenenonylphenyl ether
5: Troysol S-366 (produced by Troy Chemical)

[Basic Compound]
E1: N,N-diethylaniline
E2: N,N-bis(hydroxyethyl)aniline
E3: trioctylamine
E4: triphenylimidazole
E5: antipyrine
E6: 2,6-diisopropylaniline

[Solvent]
S1: propylene glycol monomethyl ether acetate
S2: propylene glycol monomethyl ether
S3: γ-butyrolactone
S4: ethyl lactate
S5: butyl acetate
S6: 2-heptanone
S7: cyclohexanone As apparent from the results in Table 2, the composition of the present invention is excellent in various properties.

This application is based on Japanese patent application JP 2004-16613, filed on Jan. 26, 2004, the entire content of which is hereby incorporated by reference, the same as if set forth at length.

What is claimed is:

1. A positive resist composition comprising:
(A) a resin comprising a repeating unit represented by formula (I) and a repeating unit represented by formula (II), the resin increasing the dissolution rate in an alkali developer by the action of an acid;
(B) a compound capable of generating an acid upon irradiation with actinic rays or radiation; and
(C) a solvent:

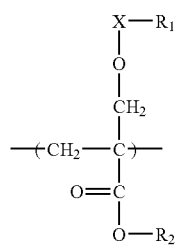

(I)

wherein $R_1$ represents a hydrogen atom or a hydrocarbon group, $R_2$ represents a hydrocarbon group, and X represents a single bond or a carbonyl group;

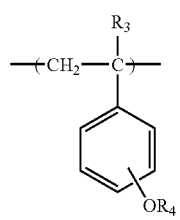

(II)

wherein $R_3$ represents a hydrogen atom, a methyl group or a halogen atom, and $R_4$ represents a group represented by the following formula (A):

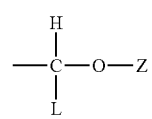

(A)

wherein L represents a hydrogen atom, an alkyl group, a cycloalkyl group or an aralkyl group, and Z represents a cycloalkyl group, an aralkyl group, or an alkyl group having a cyclic carbon structure as a substituent, provided that at least one of $R_2$ and $R_4$ is a group capable of decomposing by the action of an acid.

2. The positive resist composition as claimed in claim 1, wherein $R_2$ in formula (I) is any one of the following formulae (pI) to (pV):

(pI)

(pII)

(pIII)

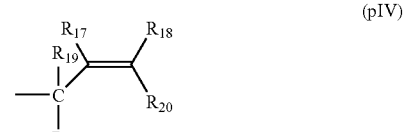

(pIV)

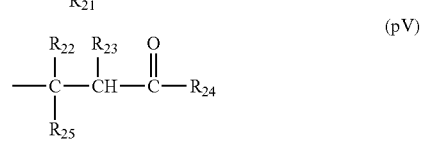

(pV)

wherein $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents a linear or branched alkyl group having from 1 to 4 carbon atoms or an alicyclic hydrocarbon group, provided that at least one of $R_{12}$ to $R_{14}$ and either one of $R_{15}$ and $R_{16}$ represent an alicyclic hydrocarbon group, $R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

3. The positive resist composition as claimed in claim 1, wherein the substitution position of —$OR_4$ in the formula (II) is the para-position of the benzene ring.

4. The positive resist composition as claimed in claim 1, wherein the resin (A) further comprises a polyhydroxystyrene repeating unit.

5. The positive resist composition as claimed in claim 1, wherein when —$OR_4$ in formula (II) is an acid-decomposable group, the resin (A) further comprises a polyhydroxystyrene repeating unit.

6. The positive resist composition as claimed in claim 1, wherein the solvent (C) is a mixed solvent containing a solvent of the following Group A and at least one solvent selected from the following Groups B and C:
   Group A: propylene glycol monomethyl ether acetate,
   Group B: propylene glycol monomethyl ether, and ethyl lactate,
   Group C: γ-butyrolactone, and propylene carbonate.

7. The positive resist composition as claimed in claim 1, wherein the solvent (C) is a mixed solvent containing a solvent of the following Group D and at least one solvent selected from the following Groups B and F:
   Group D: 2-heptanone,
   Group E: propylene glycol monomethyl ether, ethyl lactate, and butyl acetate,
   Group F: γ-butyrolactone, and propylene carbonate.

8. The positive resist composition as claimed in claim 1, which further comprises (D) a surfactant.

9. The positive resist composition as claimed in claim 1, which further comprises (E) an organic basic compound.

10. A pattern formation method comprising:
    (1) forming a resist film from a positive resist composition comprising:
    (A) a resin comprising a repeating unit represented by formula (I) and a repeating unit represented by formula (II), the resin increasing the dissolution rate in an alkali developer by the action of an acid;
    (B) a compound capable of generating an acid upon irradiation with actinic rays or radiation; and
    (C) a solvent:

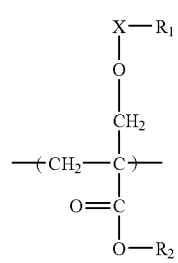

wherein $R_1$ represents a hydrogen atom or a hydrocarbon group, $R_2$ represents a hydrocarbon group, and X represents a single bond or a carbonyl group;

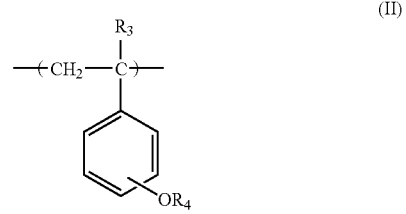

wherein $R_3$ represents a hydrogen atom, a methyl group or a halogen atom, and $R_4$ represents a group represented by the following formula (A):

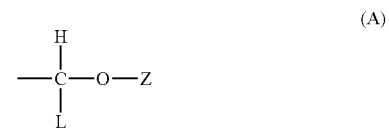

wherein L represents a hydrogen atom, an alkyl group, a cycloalkyl group or an aralkyl group, and Z represents a cycloalkyl group, an aralkyl group, or an alkyl group having a cyclic carbon structure as a substituent,
provided that at least one of $R_2$ and $R_4$ is a group capable of decomposing by the action of an acid;
    (2) irradiating electron beam, X-ray or EUV on said resist film; and
    (3) developing said resist film with an alkali developer.

11. The pattern forming method as claimed in claim 10, wherein $R_2$ in formula (I) is any one of the following formulae (pI) to (pV):

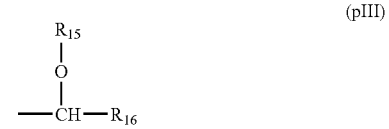

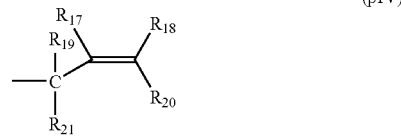

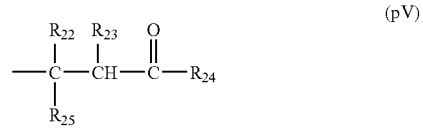

wherein $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents a linear or branched alkyl group having from 1 to 4 carbon atoms or an alicyclic hydrocarbon group, provided that at least one of $R_{12}$ to $R_{14}$ and either one of $R_{15}$ and $R_{16}$ represent an alicyclic hydrocarbon group, $R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

12. The pattern forming method as claimed in claim 10, wherein the substitution position of —$OR_4$ in the formula (II) is the para-position of the benzene ring.

13. The pattern forming method as claimed in claim 10, wherein the resin (A) further comprises a hydroxystyrene repeating unit.

14. The pattern forming method as claimed in claim 10, wherein when —$OR_4$ in formula (II) is an acid-decomposable group, the resin (A) further comprises a hydroxystyrene repeating unit.

15. The pattern forming method as claimed in claim 10, wherein the solvent (C) is a mixed solvent containing a solvent of the following Group A and at least one solvent selected from the following Groups B and C:

Group A: propylene glycol monomethyl ether acetate,

Group B: propylene glycol monomethyl ether, and ethyl lactate,

Group C: γ-butyrolactone, and propylene carbonate.

16. The pattern forming method as claimed in claim 10, wherein the solvent (C) is a mixed solvent containing a solvent of the following Group D and at least one solvent selected from the following Groups B and F:

Group D: 2-heptanone,

Group B: propylene glycol monomethyl ether, ethyl lactate, and butyl acetate,

Group F: γ-butyrolactone, and propylene carbonate.

17. The pattern forming method as claimed in claim 10, which further comprises (D) a surfactant.

18. The pattern forming method as claimed in claim 10, which further comprises (E) an organic basic compound.

* * * * *